(12) United States Patent
Lau

(10) Patent No.: US 11,160,194 B2
(45) Date of Patent: Oct. 26, 2021

(54) HOT SWAP CONDENSOR FOR IMMERSION COOLING

(71) Applicant: LiquidStack Holding B.V., Amsterdam (NL)

(72) Inventor: Kar-Wing Lau, Hong Kong (CN)

(73) Assignee: LiquidStack Holding B.V., Amsterdam (NL)

( * ) Notice: Subject to any disclaimer, the term of this patent is extended or adjusted under 35 U.S.C. 154(b) by 0 days.

(21) Appl. No.: 16/683,958

(22) Filed: Nov. 14, 2019

(65) Prior Publication Data

US 2021/0153386 A1 May 20, 2021

(51) Int. Cl.
| | |
|---|---|
| *H05K 7/20* | (2006.01) |
| *B66C 23/90* | (2006.01) |
| *B66C 17/12* | (2006.01) |
| *B66C 19/00* | (2006.01) |
| *B66C 23/36* | (2006.01) |
| *B66C 23/34* | (2006.01) |

(52) U.S. Cl.
CPC ......... *H05K 7/20327* (2013.01); *B66C 17/12* (2013.01); *B66C 19/005* (2013.01); *B66C 23/346* (2013.01); *B66C 23/36* (2013.01); *B66C 23/905* (2013.01); *H05K 7/203* (2013.01); *H05K 7/20318* (2013.01)

(58) Field of Classification Search
None
See application file for complete search history.

(56) References Cited

U.S. PATENT DOCUMENTS

| | | | | |
|---|---|---|---|---|
| 5,203,970 | A * | 4/1993 | Ellis, Jr. | B01D 3/02 |
| | | | | 202/175 |
| 6,313,990 | B1* | 11/2001 | Cheon | G06F 1/181 |
| | | | | 165/104.33 |
| 9,516,792 | B2* | 12/2016 | Krishnan | H05K 7/20236 |
| 10,401,924 | B2* | 9/2019 | Saito | H05K 7/20272 |
| 10,477,726 | B1 | 11/2019 | Enright et al. | |
| 10,645,841 | B1 | 5/2020 | Mao et al. | |
| 2007/0227702 | A1* | 10/2007 | Bhatti | F28D 7/024 |
| | | | | 165/104.21 |
| 2009/0084131 | A1* | 4/2009 | Reifel | F24F 13/30 |
| | | | | 62/515 |
| 2014/0218861 | A1 | 8/2014 | Shelnutt et al. | |
| 2015/0151953 | A1* | 6/2015 | Weterings | B66C 13/08 |
| | | | | 212/273 |
| 2015/0292816 | A1* | 10/2015 | Mastroianni | F24F 1/36 |
| | | | | 62/285 |

(Continued)

OTHER PUBLICATIONS

International Search Report and Written Opinion in PCT/IB2020/060701, dated Feb. 5, 2021 13 pages.

*Primary Examiner* — Courtney L Smith
(74) *Attorney, Agent, or Firm* — Goodwin Procter LLP

(57) ABSTRACT

A device for and method of hot swapping one or more electronic devices from an immersion cooling tank having a first opening, the device including a condensing device removably locatable in the first opening of the immersion cooling tank, the condensing device having a condensing coil forming a second opening through which the electronic device(s) is removable and an apparatus coupled to the condensing device for selectively adjusting a height and/or a location of the condensing device about the first opening of the immersion cooling tank.

27 Claims, 22 Drawing Sheets

(56) References Cited

U.S. PATENT DOCUMENTS

| | | | |
|---|---|---|---|
| 2015/0334880 A1* | 11/2015 | Best | H05K 7/20236 |
| | | | 361/679.47 |
| 2017/0064862 A1* | 3/2017 | Miyoshi | H01L 21/67109 |
| 2017/0295676 A1* | 10/2017 | Conn | H05K 7/20236 |
| 2018/0303008 A1* | 10/2018 | Shen | H05K 7/203 |
| 2019/0159360 A1 | 5/2019 | Uchida | |
| 2020/0089293 A1* | 3/2020 | Enright | H05K 7/1492 |
| 2020/0093025 A1 | 3/2020 | Enright et al. | |

* cited by examiner

HOT SWAP CONDENSOR FOR IMMERSION COOLING

FIELD OF THE INVENTION

The present invention relates to immersion cooling equipment, specifically to removing objects from an immersion cooling tank and, more specifically, to removing electronic or electrical equipment or devices from a heat transfer fluid contained in an immersion cooling tank without altering the operation of other objects within the immersion cooling tank, while minimizing the loss of heat transfer fluid.

BACKGROUND OF THE INVENTION

Heat generated by electronic equipment and devices may be removed by convection and/or conduction using, for example, a heat exchanger, an immersion cooling tank, and so forth. Heat removal by immersion cooling may include direct and indirect methods, as well as single- and two-phase approaches. For example, for two-phase immersion cooling, in a first phase, heat generated by operating electronic or electric equipment or devices vaporizes the heat transfer fluid and/or coolant in which the electronic or electric equipment or devices are immersed. In a second phase, heat transfer fluid vapor produced in the immersion cooling tank, upon contact with an exterior surface of a condensing device, e.g., condensing coils through which a cooling fluid flows at a prescribed flow rate and temperature, condenses. The condensate may then be added back, e.g., by gravity feeding, into the immersion cooling tank.

In certain instances, a dielectric fluid may be used as the heat transfer fluid and/or coolant. Dielectric fluids have high resistivity to the transmission or conduction of electrical current, which minimizes and/or prevents electrical current from the operating electronic or electric equipment or devices arcing and damaging other components of the electronic or electric equipment or devices. As a result, non-hermetically-sealed electronic equipment or devices can be immersed in a dielectric fluid used as the heat transfer fluid. Optionally, a heat transfer fluid with electrical conductivity may be used in the immersion cooling equipment; however, in that application, the cooled electronic equipment or devices should be hermetically sealed.

Conventionally, immersion cooling may take place in an immersion cooling tank or bath that may be sealed or semi-open. In some applications, it is preferred that the bath be hermetically sealed to prevent the escape and loss of heat transfer fluid vapor into the environment. Furthermore, heat transfer fluid may be expensive to replace.

Problematically, maintenance of the electronic or electric equipment or devices may be required from time to time, which is further complicated with a sealed bath that does not allow easy access to the electronics or electric equipment inside. For this reason, in some applications, a semi-open or selectively sealable bath may be preferred. Advantageously, a semi-open or a selectively sealable bath enables users to hot swap electronic or electric equipment or devices from the immersion cooling tank. In some applications, hot swap may refer to disconnecting (and/or reconnecting) some electronic or electric equipment or devices contained in an immersion cooling tank while other electronic or electric equipment or devices contained in the same immersion cooling tank continue to operate. As previously mentioned, however, the semi-open or selectively sealable bath may release heat transfer fluid vapor into the environment.

Alternative approaches to hot swapping provide unsatisfactory or unacceptable consequences. For example, the electronic or electric equipment or devices may be turned off so that the heat generated by their operation does not produce heat transfer fluid vapors to escape into the environment. This approach, however, may result in an undesirable loss of productivity and an unacceptable down time. Instead of being turned off, the electronic or electric equipment or devices also may be operated, such that the heat generated is insufficient to boil the heat transfer fluid, transforming the heat transfer fluid into a heat transfer fluid vapor. This approach also may result in an undesirable loss of productivity and an unacceptable down time.

Yet another approach may involve operating a main condenser, on which the heat transfer fluid vapor condenses, e.g., constantly or for an extended time, at a much lower temperature than the boiling point of the heat transfer fluid, to promote maximum condensation of the heat transfer fluid vapor. This technique is undesirably (energy) inefficient.

In still another approach, the loss of heat transfer fluid vapor may be reduced by employing a condenser configured to include multiple levels of, e.g., two or three, condensing coils, one coil atop another coil.

SUMMARY OF THE INVENTION

In some embodiments, the purpose of the present invention is to provide an apparatus for hot swapping electronic or electrical equipment or devices from an immersion cooling tank containing a boiling heat transfer fluid that reduces the loss of heat transfer fluid vapor into the environment.

In some applications, some or all of the heat transfer fluid vapor produced inside an immersion cooling tank may be removed by a main condenser running coolant at a temperature proximate or similar to room temperature. In other applications, some or all of the heat transfer fluid vapor produced inside an immersion cooling tank may be transported away actively or passively to a heat exchanger system separated from the immersion cooling tank, such that there is no main condenser inside.

In a first aspect, the present invention relates to a device for hot swapping one or more electronic devices from an immersion cooling tank having a first opening. In some embodiments, the device includes a condensing device, removably locatable in the first opening of the immersion cooling tank, the condensing device having a condensing coil forming a second opening through which the electronic device(s) is removable; and an apparatus (e.g., a crane) coupled to the condensing device for selectively adjusting a height and/or a location of the condensing device about the first opening of the immersion cooling tank. In some implementations, the condensing device may further include an outer rim portion connected to a topmost portion of the condensing coil. In some applications, an outer peripheral surface of the condensing coil may be adapted to fit within an inner peripheral surface of the immersion cooling tank. Alternatively, in another application, one or more of the outer peripheral dimensions of the outer rim portion of the condensing device may be larger than one or more of the inner peripheral dimensions of the immersion cooling tank.

In some applications, the crane may include a lifting arm for adjusting the height of the condensing device, a movable platform operatively coupled to the lifting arm for adjusting the location of the condensing device, and a plurality of casters operatively coupled to a bottom portion of the movable platform for positioning the movable platform. In some variations, the crane may be integrated into a movable device such as a self-powered device, an externally powered device, a forklift, and a truck.

In some embodiments, the device may also include one or more of: a coolant container in fluid communication with the condensing device, a chiller pump for circulating a coolant fluid from the coolant container to the condensing device, an item lock selectively attachable to the electronic device(s), and an apparatus for adjusting a height of the item lock, e.g., a pulley system. In some implementations, the pulley system may include a plurality of sheaves, a winch (e.g., a hand-operated winch or a motor-driven winch), and a hoist wire disposed through sheaves and having a proximal end operatively attached to the winch and a distal end operatively attached to the item lock. Alternatively, the apparatus for adjusting the height of the item lock may include a chain hoist/forklift assembly or a belt-drive/forklift assembly. In some implementations, the chain hoist/forklift assembly may include a number of gear-wheels operatively coupled to a winch and about which a roller chain, to which a mounting bracket may be coupled, may revolve.

In a second aspect, the present invention relates to a method of hot swapping one or more electronic devices from an immersion cooling tank having a first opening. In some embodiments, the method may include providing a condensing device having a condensing coil forming a second opening, selectively adjusting a height and a location of the condensing device about the first opening of the immersion cooling tank, inserting an item lock into the immersion cooling tank through the second opening, and removing, with the item lock, the electronic device(s) from the immersion cooling tank via the second opening. In some variations, the second opening is smaller than the first opening.

In some implementations, selectively adjusting the height and the location of the condensing device may include using a crane and inserting the item lock may include using a pulley system to at least one of raise and lower the item lock.

In a third aspect, the present invention relates to a condensing device for use in hot swapping one or more electronic devices from an immersion cooling tank having a first opening, In some embodiments, the condensing device includes a condensing coil (e.g., a layered coil, such that at an upper coil is located atop a lower coil) forming a second opening through which the electronic device(s) is removable. In some implementations, the condensing device may include an outer rim portion connected to a topmost portion of the condensing coil. Moreover, in some variations, one or more of the outer peripheral dimensions of the outer rim portion is larger than one or more of the inner peripheral dimensions of the immersion cooling tank.

In some implementations, the condensing device may include one or more of: a connection device (e.g., a pair of lifting shackles) for releasably attaching the condensing coil to a lifting device and/or a plurality of attaching devices located on the outer rim portion for releasably attaching the outer rim portion to the immersion cooling tank. In further embodiments, the condensing device may be directly and fixedly attached to at least one of the lifting device and a plurality of attaching devices.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described.

FIG. 1A is a side view of a first embodiment of a device for hot swapping an object, in which the condensing device is positioned above an immersion cooling tank containing the object, in accordance with some embodiments of the present invention;

FIG. 1B depicts a detail of an illustrative embodiment of the condensing device in FIG. 1A;

FIG. 7B depicts a detail of an embodied method of securely attaching the condensing device of FIG. 7A to a flange about the rim of the opening of the immersion cooling tank, in accordance with some embodiments of the present invention;

FIG. 16B depicts a detail of the item lock depicted in FIG. 16A, in accordance with some embodiments of the present invention;

FIG. 17B depicts a detail of the adjustable condensing device depicted in FIG. 17A, in a minimum opening mode that includes gaps between C-shaped portions, in accordance with some embodiments of the present invention;

FIG. 17C depicts a detail of the adjustable condensing device depicted in FIG. 17A, in a maximum opening mode that includes gaps between C-shaped portions, in accordance with some embodiments of the present invention;

FIG. 17D depicts a detail of the adjustable condensing device depicted in FIG. 17A, in which the condenser assemblies overlap each other, in accordance with some embodiments of the present invention;

FIG. 17E depicts a detail of the adjustable condensing device depicted in FIG. 17A, in a maximum opening mode that includes L-shaped portions and touching end pieces, in accordance with some embodiments of the present invention;

FIG. 17F depicts a detail of the adjustable condensing device depicted in FIG. 17A, in in a minimum opening mode that includes L-shaped portions and touching end pieces, in accordance with some embodiments of the present invention;

DETAILED DESCRIPTION

Figures 1A, 1B:
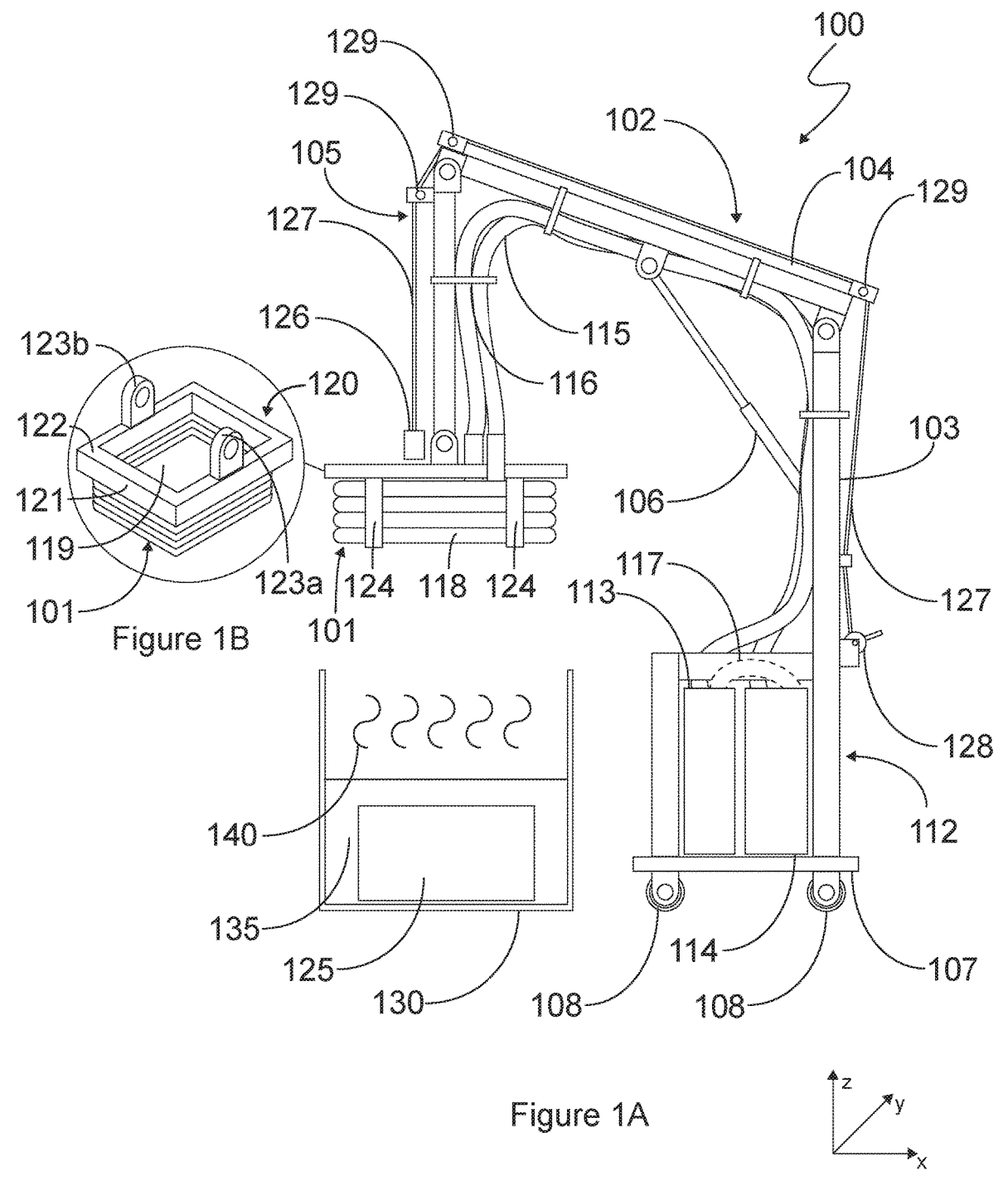
Figure 2:
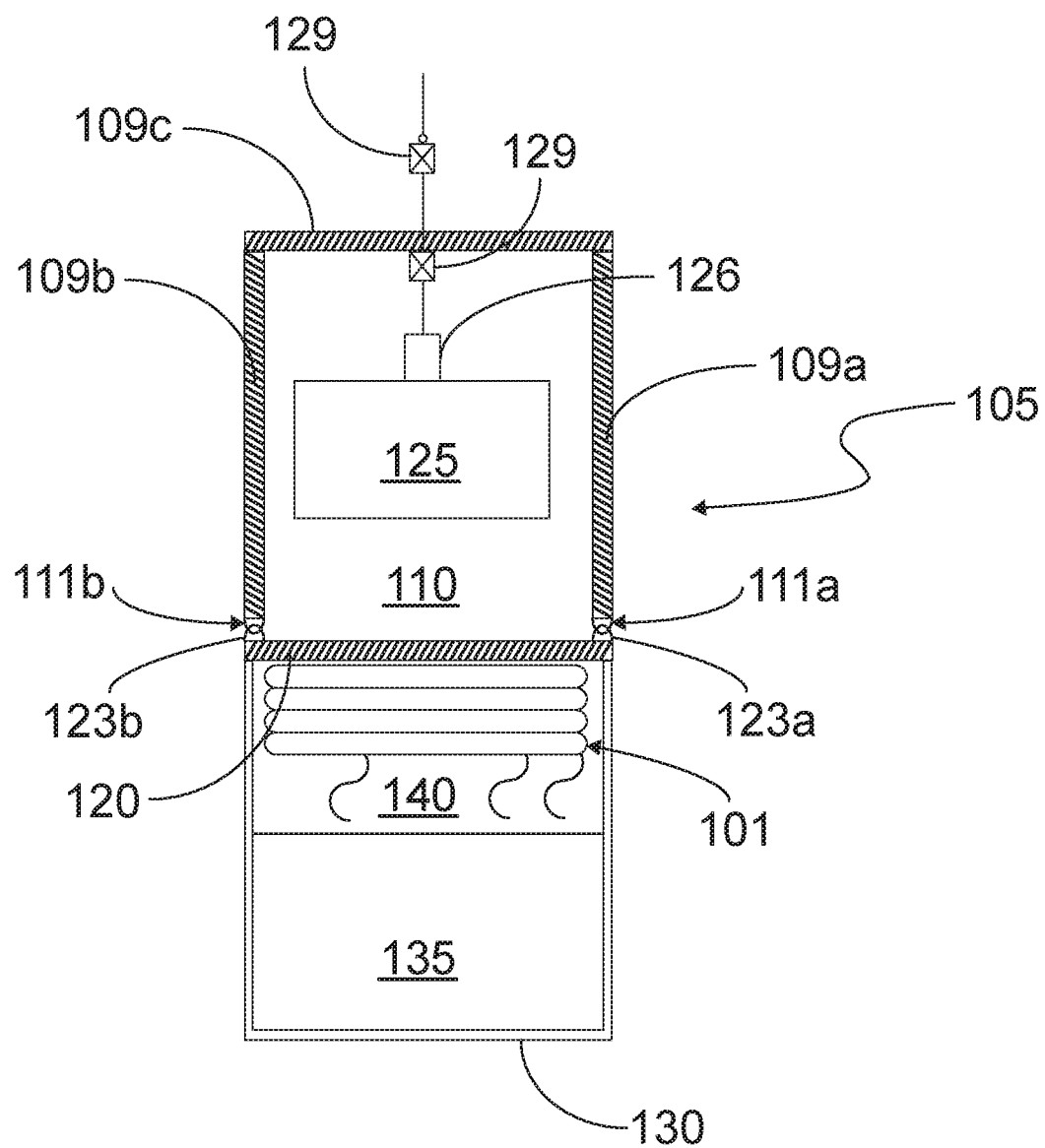
FIG. 2 depicts a front view of an illustrative embodiment of a raising/lowering portion of the device depicted in FIG. 1A, in accordance with some embodiments of the present invention.

Referring to FIGS. 1A through 3A, an illustrative first embodiment of a device 100 for hot swapping an object 125, e.g., electronic or electric equipment or device, from an immersion cooling tank 130 containing a bath of a heat transfer fluid 135 is depicted. Advantageously, some or all of heat transfer fluid vapor 140 produced inside the immersion cooling tank 130 may be condensed and returned to the immersion cooling tank 130 using a (e.g., main) condenser 101 that is selectively locatable within, at, on, or above the immersion cooling tank 130 and that is, further, structured and arranged to circulate a coolant at desired temperature (e.g., at room temperature). In another application, some or all of heat transfer fluid vapor 140 produced inside the immersion cooling tank 130 may be transported away actively or passively to a heat exchanger system that is located separate from the immersion cooling tank 130, so that there is no (e.g., main) condenser 101 disposed within the opening of the immersion cooling tank 130.

In some embodiments, the device 100 may include a (e.g., main) condensing device 101 that is releasably coupled to an apparatus 102 for selectively adjusting the height (z-direction) and the location (x- and y-directions) of the condensing device 101 with respect to an opening provided in the immersion cooling tank 130.

In one implementation, the apparatus 102 for selectively adjusting the height and location of the condensing device 101 may consist of or consist essentially of a crane having a vertical support portion 103, a boom portion 104, and a raising/lowering portion 105. In some variations, the condensing device 101 may be configured to be releasably attachable to a distal end of the raising/lowering portion 105, such that translation of the raising/lowering portion 105 may be accompanied by a raising or lowering of the condensing device 101 (e.g., in a z-direction).

In some implementations, the boom portion 104, at its proximal end, may be hingedly coupled to the vertical support portion 103 and, at its distal end, may be hingedly coupled to the raising/lowering portion 105. A lifting arm 106, e.g., an hydraulic cylinder, may be hingedly coupled (e.g., at its proximal end) to the vertical support portion 103, e.g., at about the mid-span or mid-length of the vertical support portion 103, and may be hingedly coupled (e.g., at its distal end) to the boom portion 104, such that operation of the lifting arm 106 may cause the boom portion 104 to rotate about the hinge at the vertical support portion 103. Advantageously, rotation of the boom portion 104 about the hinge at the vertical support portion 103 may cause the raising/lowering portion 105 to translate in a z-direction, e.g., up or down with respect to a planar (e.g., an xy-plane) surface, e.g., the floor. Rotation of the boom portion 104 about the hinge with the vertical support portion 103 may also result in some positional movement of the condensing device 101 in the horizontal or x-direction.

In some implementations, the vertical support portion 103 of the crane may be fixedly attached to a platform 107 operatively coupled to a device(s) 108 for positioning the platform 107 relative to the immersion cooling tank 130. Although FIG. 1A depicts the platform 107 as a cart and the positioning device 108 as a plurality of casters or wheels, this is done for the purpose of illustration rather than limitation. Those skilled in the art can appreciate that a myriad of devices and apparatuses may be used for moving the device 100 in an xy-plane to position the condensing device 101 at a desired location above the xy-plane, e.g., above an opening in the immersion cooling tank 130. Such devices 108 may be motorized, self-propelled, and/or powered externally. Exemplary movable platforms may include, for the purpose of illustration rather than limitation, a truck, a forklift, and so forth.

As shown in FIG. 2, in some applications, the raising/lowering portion 105 may consist of or consist essentially of a first vertical arm 109*a* and a second vertical arm 109*b* that are each fixedly attached to a crossbeam 109*c* that is hingedly attached to the boom portion 104, such that movement (e.g., rotation) of the boom portion 104 causes rotation about the hinge connecting the crossbeam 109*c*, which results in a vertical (e.g., up/down) translation of the raising/lowering portion 105 and a corresponding raising/lowering of the condensing device 101. Advantageously, the first vertical arm 109*a*, the second vertical arm 109*b*, and the crossbeam 109*c* are structured and arranged to provide therebetween an opening 110 dimensioned to accommodate an item lock 126, as well as the object 125 to be hot swapped. The free ends of each of the first 109*a* and second vertical arms 109*b* (i.e., the ends of the vertical arms 109*a*, 109*b* that are not fixedly attached to the crossbeam 109*c*) may be configured to include a respective attaching device 111*a*, 111*b* for releasably attaching the first 109*a* and second vertical arms 109*b* to corresponding connection devices 123*a*, 123*b* fixedly attached to the condensing device 101. For example, the respective attaching devices 111*a*, 111*b* on the vertical arms 109*a*, 109*b* may include openings or holes that may be aligned with openings in the corresponding connection devices 123*a*, 123*b*. In some implementations, a pin, bolt, cotter pin, and the like may be inserted into or through the aligned openings in the attaching devices 111*a*, 111*b* of the first 109*a* and second vertical arms 109*b* and the corresponding connection devices 123*a*, 123*b* attached to the condensing device 101 to releasably attach the raising/lowering portion 105 to the condensing device 101.

In some implementations, in addition to supporting the apparatus 102 for selectively adjusting the height and location of the condensing device 101, the platform 107 may also support a coolant system 112 for providing, forcing, and/or pumping a cooling fluid (e.g., water, coolant, Freon, and so forth) through the condensing device 101 for the purpose of causing heat transfer fluid vapor to condense on an exterior surface of the condensing device 101. In some embodiments, the coolant system 112 may include a coolant container 113, a chiller pump 114, a coolant deliver conduit 115, and a coolant return conduit 116. In some variations, the coolant container 113 provides a reservoir containing a volume of fluid coolant and is configured to be in fluid communication with, so as to provide fluid coolant to, the chiller pump 114 (e.g., via a fluid conduit 117), as well as with a coolant return conduit 116. The chiller pump 114 may be configured to be in fluid communication with the coolant container 113 and the coolant delivery conduit 115. The coolant delivery conduit 115 and the coolant return conduit 116 may be in fluid communication with the condensing coils 118 of the condensing device 101. For such an embodiment, the upper condensing coil 118 has an inlet and an outlet (attached to the coolant delivery conduit 115 and the coolant return conduit 116, respectively) and all of the condensing coils 118 provide fluid communication between the inlet and outlet. In some implementations, in operation, the chiller pump 114 extracts fluid coolant from the coolant container 113 via the fluid conduit 117, forcing the fluid coolant serially through the coolant delivery conduit 115, the condensing device 101, the coolant return conduit 116, and back into the coolant container 113.

Advantageously, in some variations, the chiller pump 114 may selectively and actively control the flow rate of the fluid coolant and the coolant container 113 may selectively and actively control the temperature of the fluid coolant. Controlling the temperature and flow rate of the fluid coolant may enable the user to control the rate and degree of condensation of the heat transfer fluid vapor 140 on the exterior surface of the coils 118 of the condensing device 101.

In some embodiments, as depicted in the drawings, the condensing device 101 may consist of or consist essentially of a condensing coil(s) 118 that is configured to have a shape and to provide an opening 119. The shape and dimensions of the condensing device 101 and the condensing coil 118 may be selected or designed, such that the shape and dimension are consistent with those of the immersion cooling tank 130. More specifically, the shape and dimension of the condensing device 101 and the condensing coil 118 may be selected so that, the condensing coil 118 may be inserted into, at, or above the opening of the immersion cooling tank 130 with sufficient clearance, e.g., a gap, between an outer peripheral surface of the condensing coil 118 and the inner peripheral surface of the immersion cooling tank 130 to prevent or minimize frictional resistance when the condensing coil 118 are inserted into the opening of the immersion cooling tank 130. The size and shape of the opening 119 in the condensing device 101 may also be dimensioned to enable a user to remove any piece of electronic or electric equipment or device 125 immersed in the heat transfer fluid bath 135.

Although FIGS. 1A and 1B depict a rectangular or substantially rectangular condensing device 101 for use with a rectangular or substantially rectangular immersion cooling tank 130, those of ordinary skill in the art can appreciate that this is done for illustrative purposes only. Indeed, the shape of the immersion cooling tank 130 and the shape of the corresponding condensing device 101 and condensing coils 118 may be square, circular, substantially circular, elliptical, substantially elliptical, and so forth.

Figure 3A:
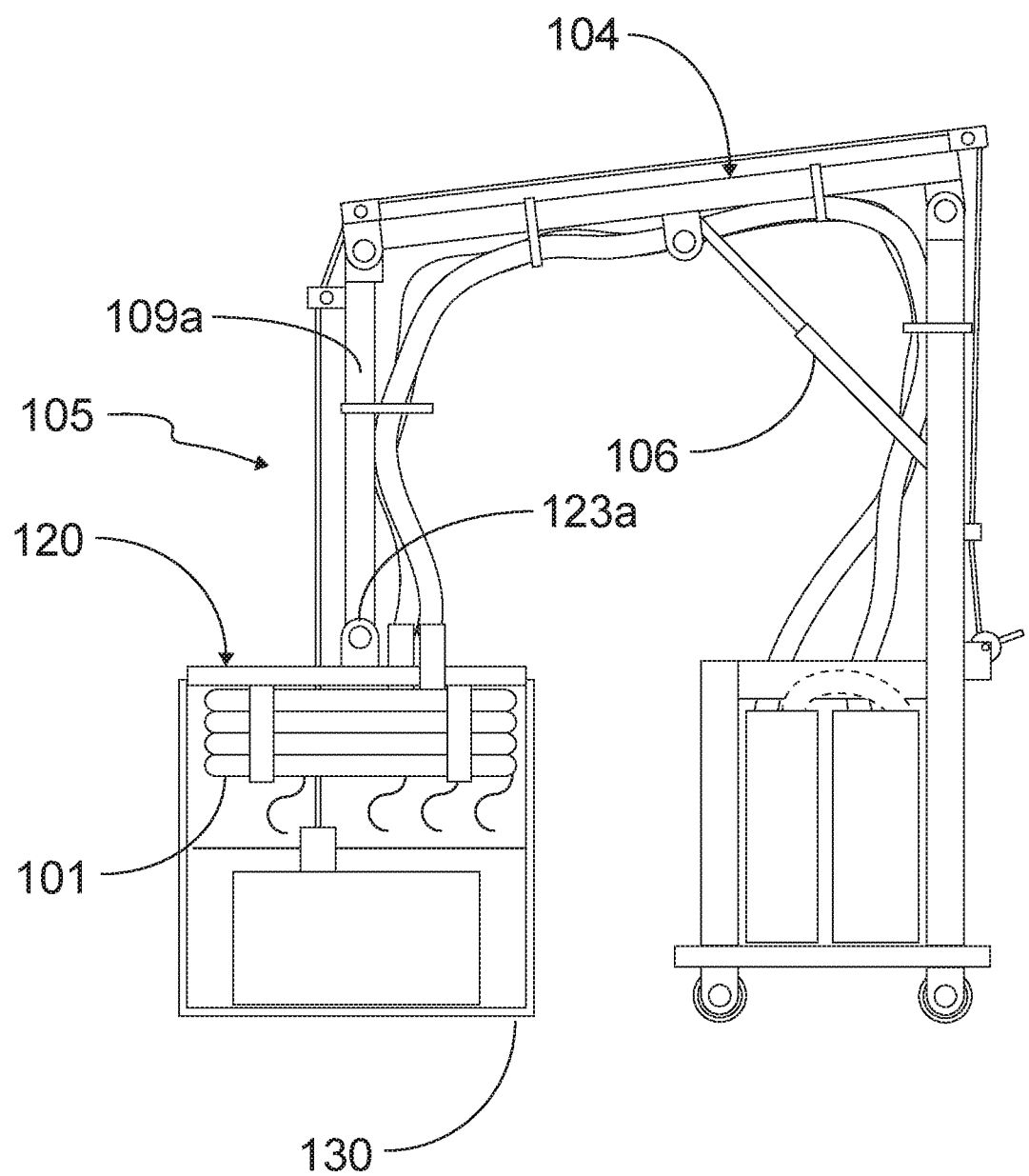
FIG. 3A depicts a side view of the device depicted in FIG. 1A, in which the condensing device is positioned at the opening of and within the immersion cooling tank, in accordance with some embodiments of the present invention.

In some embodiments, the condensing coil 118 may include a coil conduit that is configured in a (e.g., rectangular, circular, elliptical, and so forth) shape having multiple layers of tubing atop one another. In some variations, the condensing device 101 may also include an outer rim portion 120 that may be fixedly or releasably attached to the condensing coil 118. For example, in some variations, the condensing coils 118 may be fixedly or releasably attached to the (e.g., bottom surface of the) rim portion 120 using a plurality of holding elements 124 (e.g., metal straps), as shown in FIGS. 1A and 3A. In other variations, the condensing coils 118 may be fixedly or releasably attached to the boom portion 104 of the crane directly.

The inner peripheral surface of the outer rim portion 120 may be dimensioned to correspond to the size and shape of the opening 119 in the condensing device 101. The outer peripheral edge 121 of the outer rim portion 120 may be dimensioned to extend beyond or past the largest dimension of the inner peripheral surface of the opening in the immersion cooling tank 130, so that, when the condensing device 101 is properly installed, the outer rim portion 120 covers, substantially covers, or partially covers at least some portion of the rim and/or opening of the immersion cooling tank 130. Such coverage provides a temporary seal to prevent or minimize heat transfer fluid vapor 140 from escaping from the immersion cooling tank 130, e.g., while an object 125 is being removed from or being placed into the immersion cooling tank 130. Alternatively, the dimensions (e.g., length and width, circumferential, and so forth) of the outer peripheral edge 121 of the outer rim portion 120 may be dimensioned to be slightly less than the corresponding dimensions of the inner peripheral surface of the opening in the immersion cooling tank 130, such that the condenser 101 fits within the immersion cooling tank 130, providing a tight fit within the opening in the immersion cooling tank 130.

In some embodiments, a pair of connecting devices 123a, 123b, e.g., lifting shackles, may be fixedly attached to an upper surface 122 of the outer rim portion 120. As shown in FIGS. 2 and 3A, each of the pair of connecting devices 123a, 123b may be configured to releasably connect to a respective attaching device 111a, 111b of a corresponding first or second vertical arm 109a, 109b of the raising/lowering portion 105.

In some variations, the outer rim portion 120 may include an outer lip or flange portion that is structured and arranged to extend beyond and down some portion of the outer peripheral surface of the immersion cooling tank 130. The outer lip or flange portion provides a further seal to prevent or minimize heat transfer fluid vapor 140 escaping from the immersion cooling tank 130. Optionally, the outer lip or flange portion may provide a platform for an attaching device that may be used for releasably attaching the condensing device 101 to the immersion cooling tank 130. Exemplary attaching devices, for the purpose of illustration rather than limitation, may include mechanical quick connection devices (e.g., a snap catch, a locking detainer, and so forth).

Figure 3B:
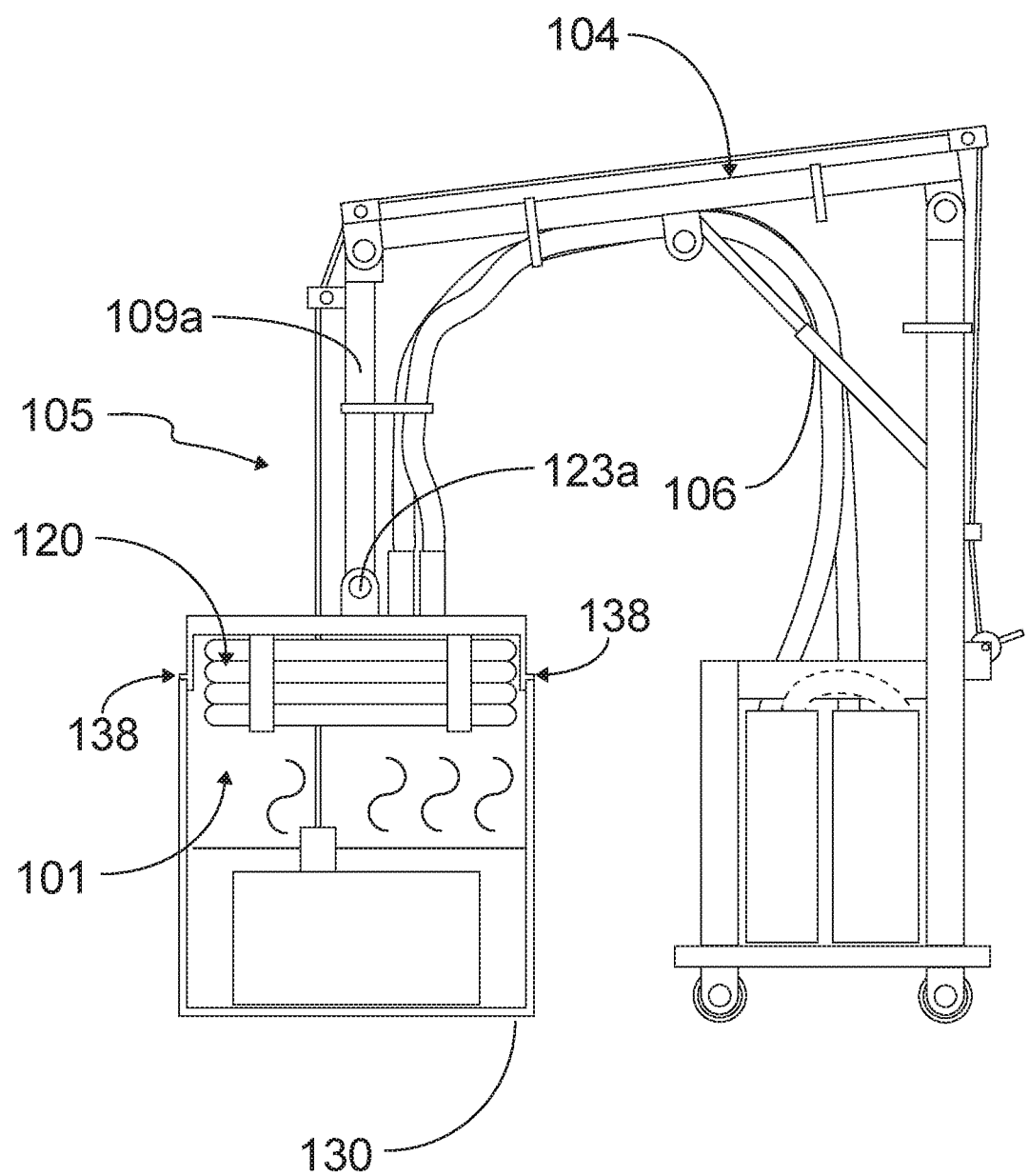
FIG. 3B depicts an alternative side view of the device depicted in FIG. 1A, in which the condensing device is positioned at the top of the opening of the immersion cooling tank using a flange formed about the outer peripheral edge of the outer rim portion of the condensing device, in accordance with some embodiments of the present invention.
Figure 3C:
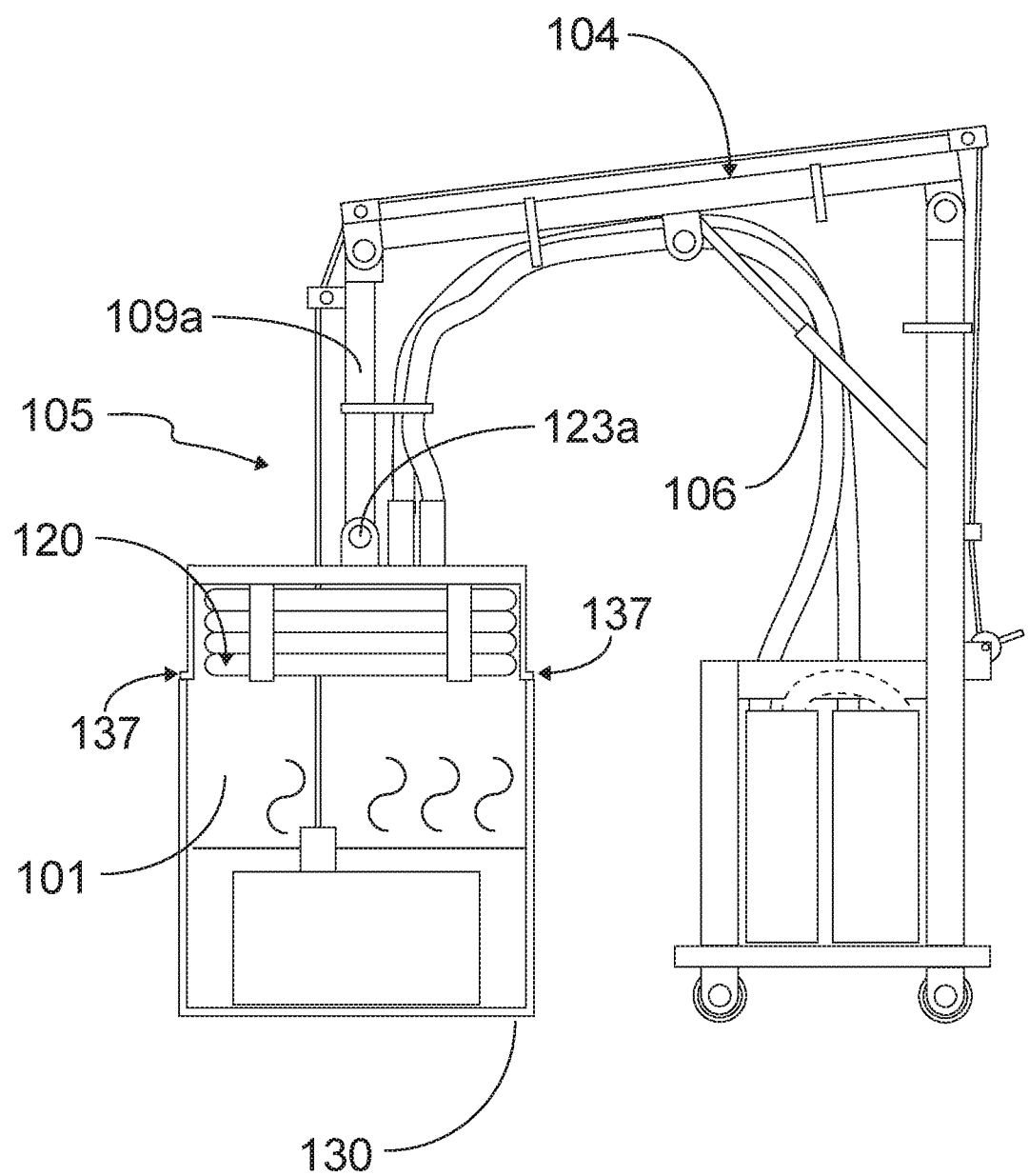
FIG. 3C depicts yet another side view of the device depicted in FIG. 1A, in which the condensing device includes a flange that rests atop the outer rim of the immersion cooling tank, in accordance with some embodiments of the present invention.
Figure 3D:
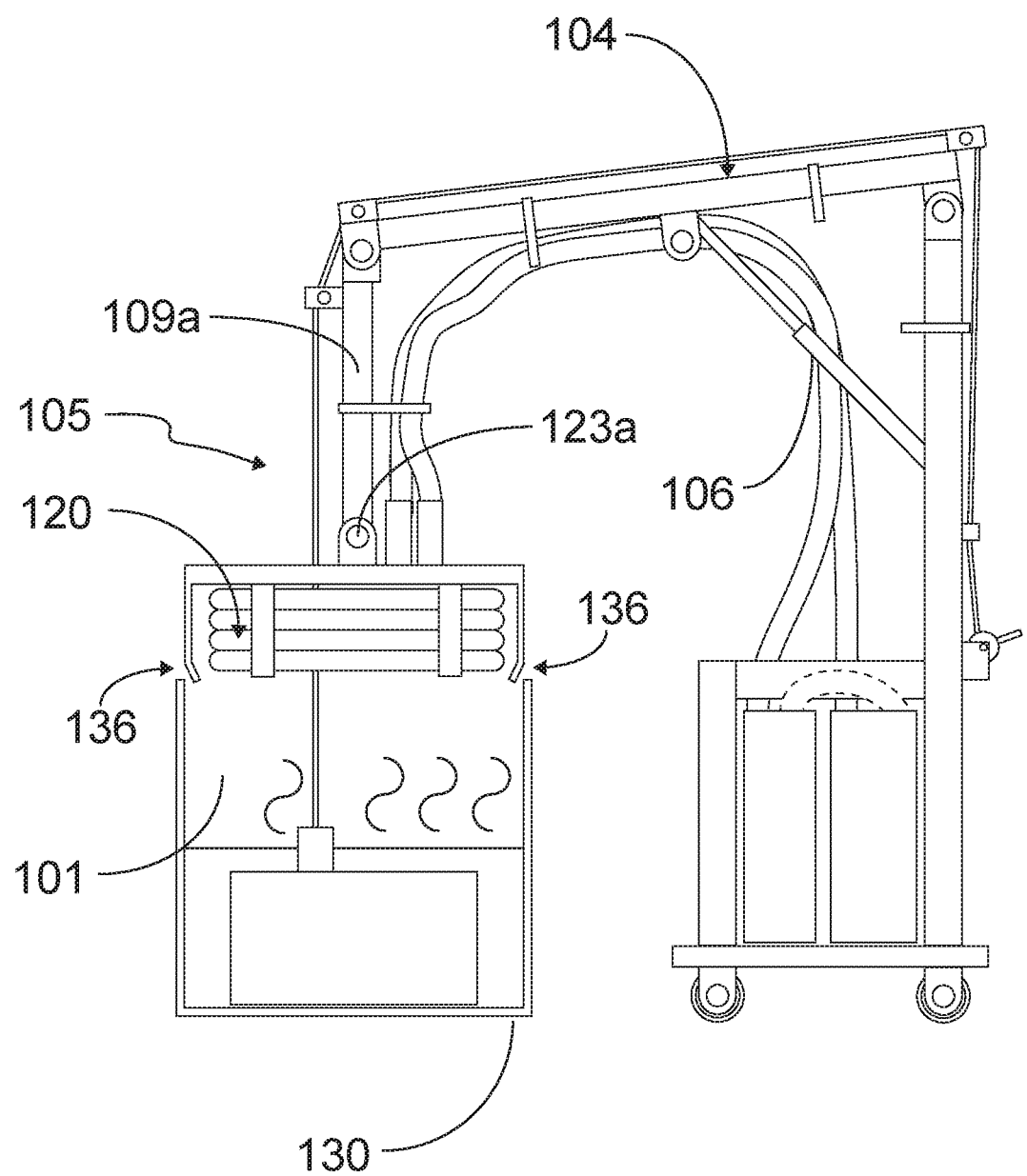
FIG. 3D depicts yet another side view of the device depicted in FIG. 1A, in which the condensing device includes a chamfered edge that is adapted to position the condensing device above the opening of the immersion cooling tank, in accordance with some embodiments of the present invention.

Various embodiments for positioning the condensing device 101 at or about the opening of the immersion cooling tank 130 are shown in FIGS. 3B through 3D. Whereas the embodiment shown in FIG. 3A depicts the condensing device 101 that is completely or substantially disposed within the immersion cooling tank 130, the immersion cooling tanks 130 shown in the embodiments shown in FIGS. 3B through 3D may only be partially disposed within the immersion cooling tank 130. For example, the embodiment shown in FIG. 3B includes a flange 138 formed about the outer peripheral edge 121 of the outer rim portion 120. Advantageously, the flange 138 and outer peripheral edge 121 are configured such that the flange 138 rests on the outer rim of the immersion cooling tank 130. As shown in FIG. 3B, all or some portion of the condensing device 101 may extend into the opening of the immersion cooling tank 130. Optionally, the condensing device 101 may be adapted such that the coils 118 remain above the opening of the immersion cooling tank 130.

In the alternative, the embodiment shown in FIG. 3C includes a flange 137 formed at the opening of the outer rim portion 120. Advantageously, the flange 137 may be configured such that the flange 137 rests atop the outer rim of the immersion cooling tank 130. As shown in FIG. 3C, the condensing device 101 is disposed substantially out of and above the immersion cooling tank 130 and may be structured and arranged to partially or completely cover the opening in the immersion cooling tank 130. Optionally, the condensing device 101 may be adapted such that some of the coils 118 extend into the opening of the immersion cooling tank 130.

In yet another alternative embodiment, as shown in FIG. 3D, the outer rim portion 120 of the condensing device may include a chamfered edge or portion 136. Advantageously, the chamfered edge 136 may be configured, such that all or some portion of the chamfered portion 136 fits within the opening of the immersion cooling tank 130. In some variations, the meshing of the chamfered portion 136 and the immersion cooling tank 130 may be adapted such that the condensing device 101 remains above and completely outside of the immersion cooling tank 130. Optionally, the condensing device 101 having a chamfered edge 136 may be configured so that a few of the coils 118 extend into the immersion cooling tank when the chamfered edge 136 is inserted into the immersion cooling tank 130. Advantageously, the condensing device 101 may fully (e.g., so as to seal) or only partially cover the opening of the immersion cooling tank 130.

Figure 4:
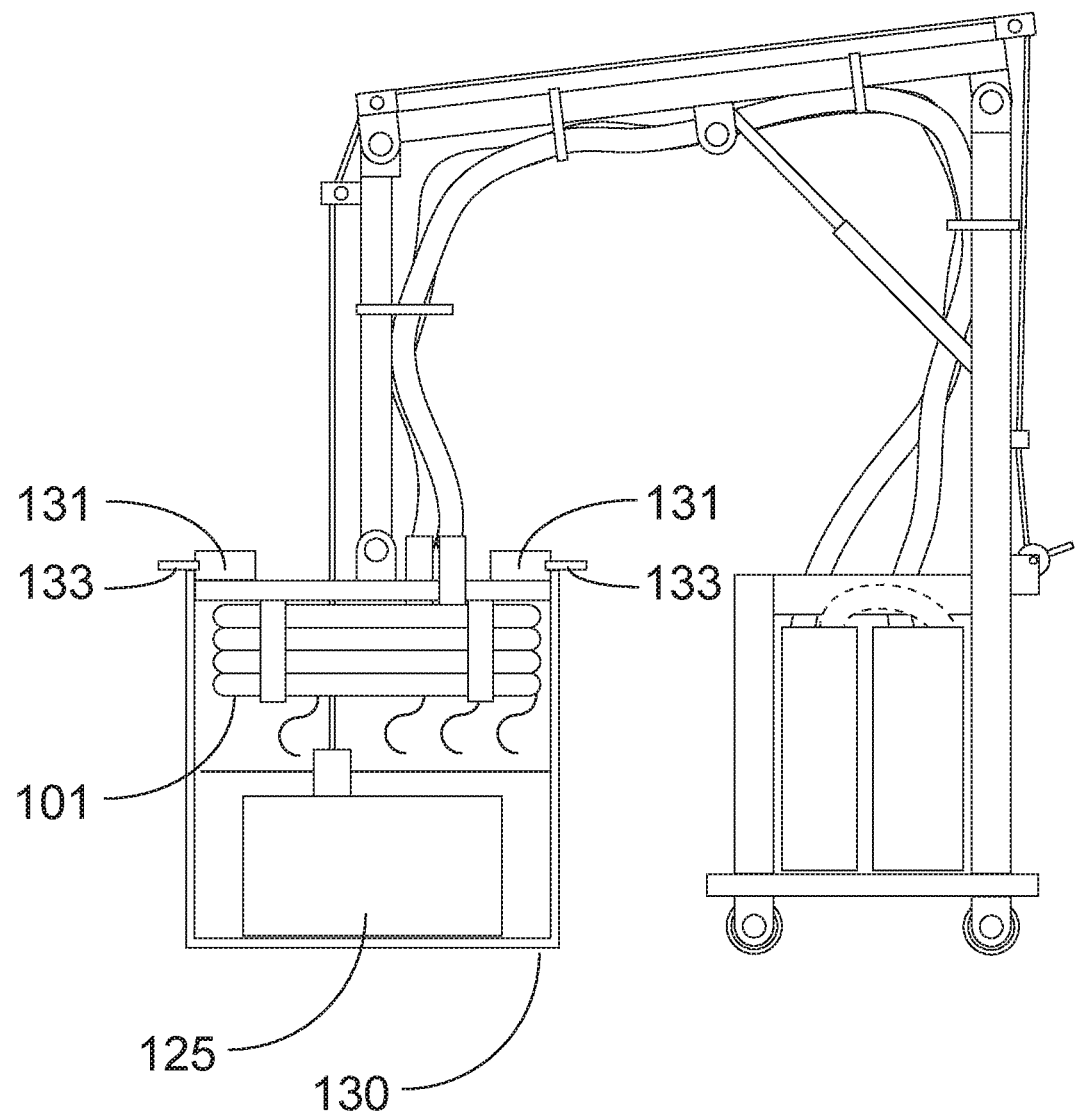
FIG. 4 is a side view of the device depicted in FIG. 1A, in which the condensing device is positioned within the immersion cooling tank and the item lock has been lowered into the immersion cooling bath and is coupled to the object to be removed, in accordance with some embodiments of the present invention.
Figure 5:
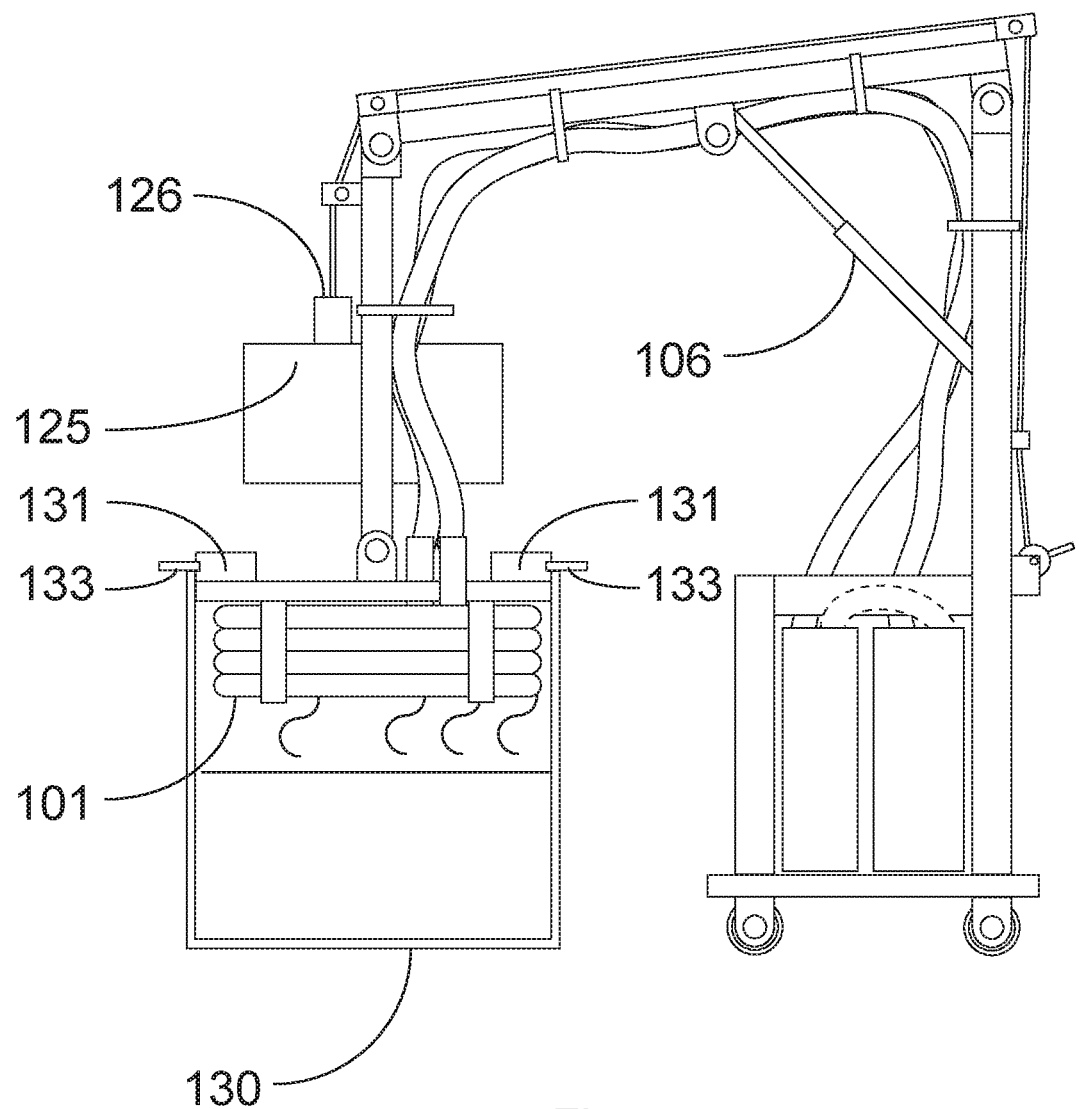
FIG. 5 is a side view of the device depicted in FIG. 1A, in which the condensing device is positioned within the immersion cooling tank and an object connected to the item lock has been raised out of the immersion cooling tank, in accordance with some embodiments of the present invention.
Figure 6:
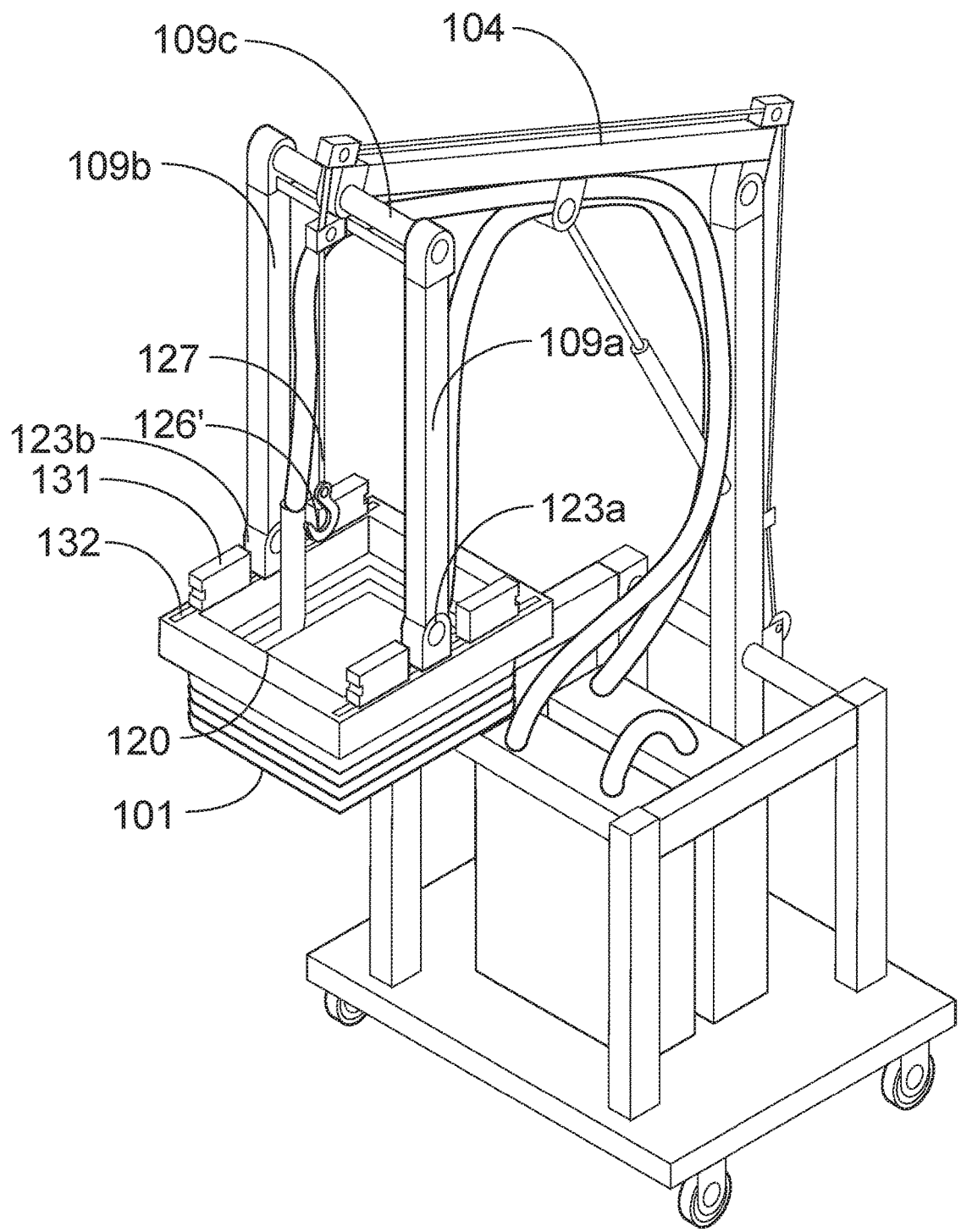
FIG. 6 depicts an isometric view of a second embodiment of a device for hot swapping an object using a hook as the item lock, in accordance with some embodiments of the present invention.

In some variations, as shown in FIGS. 4-7B, an attaching system may include position locks 131 that are disposed in sliding tracks 132 formed in the outer rim portion 120. For the purpose of illustration, rather than limitation, the attaching system may include a plurality of (e.g., four) translatable position locks 131 that are structured and arranged with a notched end for the purpose of releasably securing the position locks 131 and the condensing device 101 to a flanged portion 133 formed about the outer rim at the opening of the immersion cooling tank 130. As shown in FIG. 6, position locks 131 are slidingly attached to the outer rim portion 120 at the sliding tracks 132. In operation, after the condensing device 101 has been lowered into the immersion cooling tank 130, the position locks 131 may be (e.g., manually or automatically) translated towards the flanged portion 133, such that the notch catches the flanged portion 133, preventing removal or further movement of the condensing device 101.

In some implementations, the embodied device 100 may also include an item lock 126 that is releasably attachable to the object 125 immersed in the heat transfer fluid bath 135 for the purpose of removing the object 125 from and re-installing the object 125 into the heat transfer fluid bath 135. The item lock 126 may include any kind of a device (e.g., mechanical, magnetic, electrical, or a combination thereof) suitable for gripping, raising, holding, and lowering the object 125. Exemplary item locks 126, for the purpose of illustration rather than limitation, may include a magnet, a claw or gripper 126 (FIG. 5), a pair of grippers, a collet insert, a hook 126' and eyebolt 134 combination (FIG. 7A), a clevis 126" and eyebolt 134 combination (FIG. 10), and the like.

In some implementations, the item lock 126 may be mechanically coupled to an apparatus for adjusting the height, i.e., selectively raising and lowering, of the item lock 126. For example, a hoisting or pulley system may include a hoist wire 127, a winch 128, and a plurality of sheaves or pulleys 129. In an illustrative embodiment, the item lock 126 may be attached to a distal end of the hoist wire 127, while the winch 128 may be attached to a proximal end of the hoist wire 127. Between the distal and proximal ends, the hoist wire 127 may be routed through a plurality of sheaves or pulleys 129 that provide, inter alia, mechanical advantage to the hoisting/pulley system.

The winch 128 may be manually- and/or automatically-operated to adjust the height of the item lock 126. The item lock 126 may have a self-aligning capability to detect and clutch and/or grip the object 125. Optionally, capturing and gripping of the object 125 with the item lock 126 may be implemented manually by an operator. For example, the item lock 126 may be lowered by hand but a winch motor may be engaged to raise the item lock 126 once it is attached to an object 125 in the immersion cooling tank 130.

In some variations, as shown in FIGS. 6 through 9, the item lock may be configured as a hook 126' that is structured and arranged to mesh or lock with an eyebolt 134, lifting lug, and the like that is fixedly attached to the object 125. In operation, the hook 126' can be lowered (e.g., manually or automatically) through the opening 119 in the condensing device 101 into the heat transfer fluid 135 until the hook 126' catches the eyebolt 134, lifting lug, and the like. Once the hook 126' is coupled to the eyebolt 134, lifting lug, and the like, the hook 126' and item 125 may be raised out of the heat transfer fluid 135, through the opening 119 in the condensing device 101 to a desired elevation above the immersion cooling tank 130. Once heat transfer fluid 135 has been allowed to drained from the surface of the removed object 125, the object 125 may be removed from the hook 126'.

Figure 10:
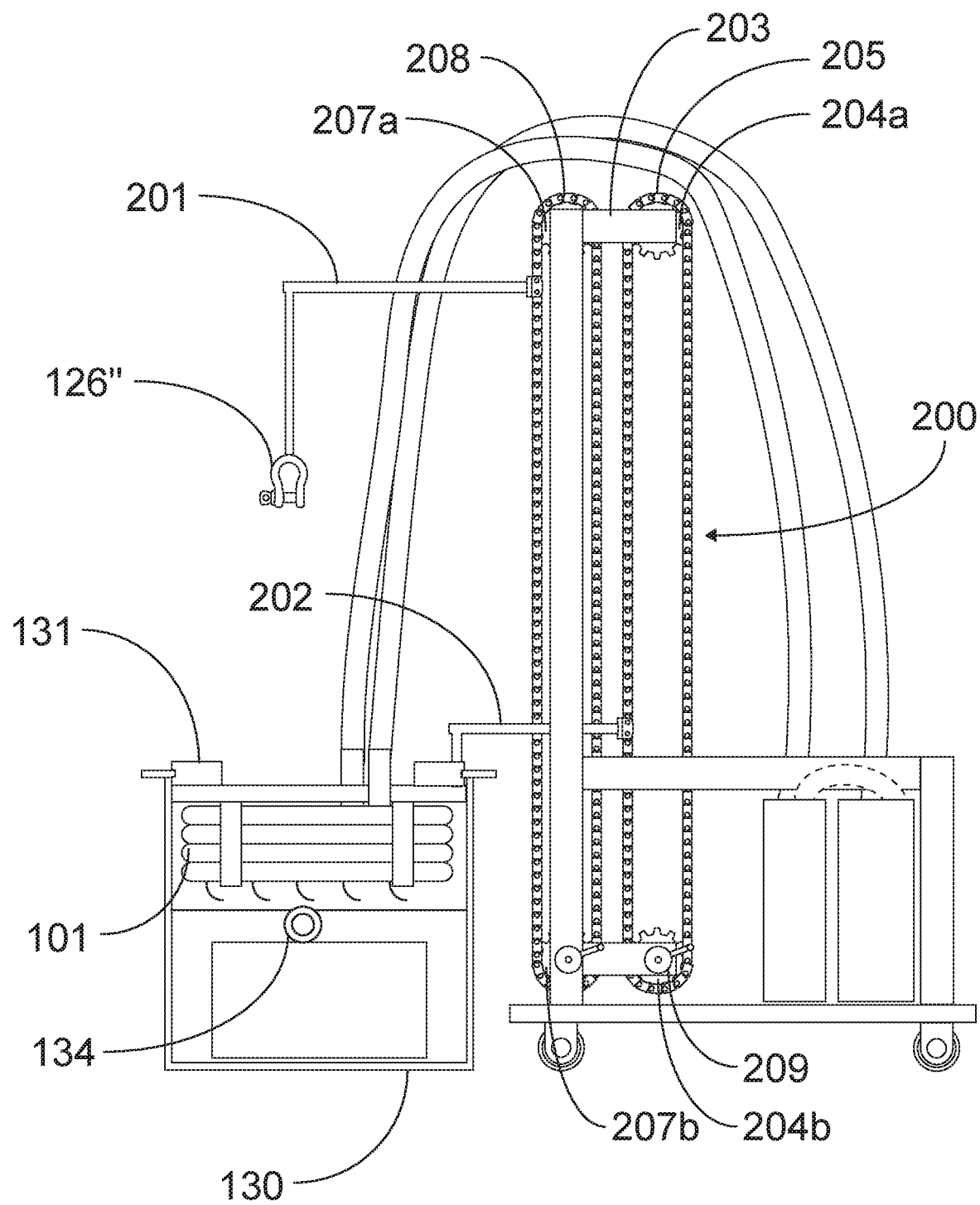
FIG. 10 depicts a side view of a third embodiment of a device for hot swapping an object that includes a clevis as the item lock and a chain hoist for adjusting the height of the object to be removed, in accordance with some embodiments of the present invention.
Figure 11:
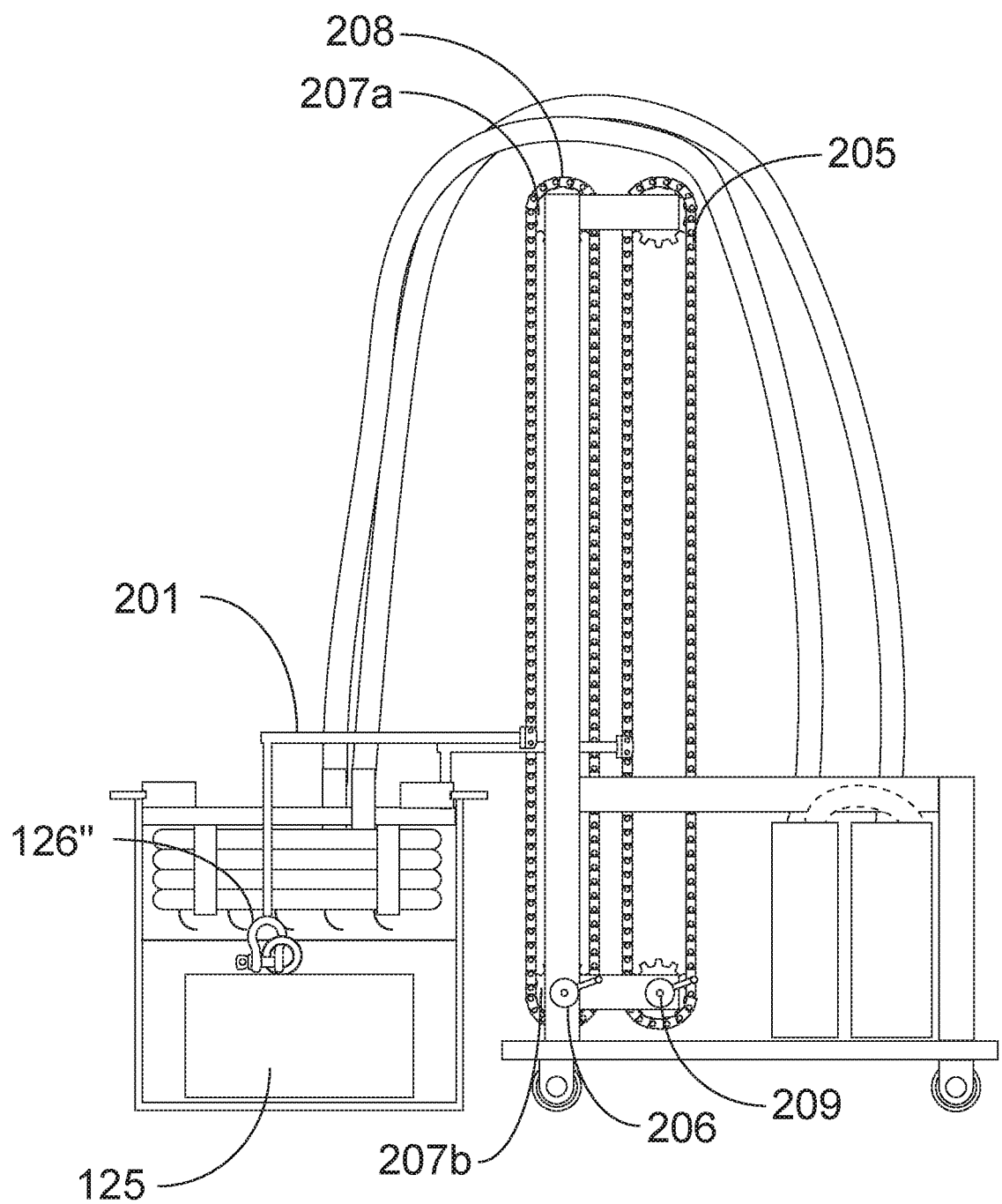
FIG. 11 depicts the device shown in FIG. 10, in which the clevis is coupled to a lifting lug on the object to be removed from the immersion cooling tank, in accordance with some embodiments of the present invention.
Figure 12:
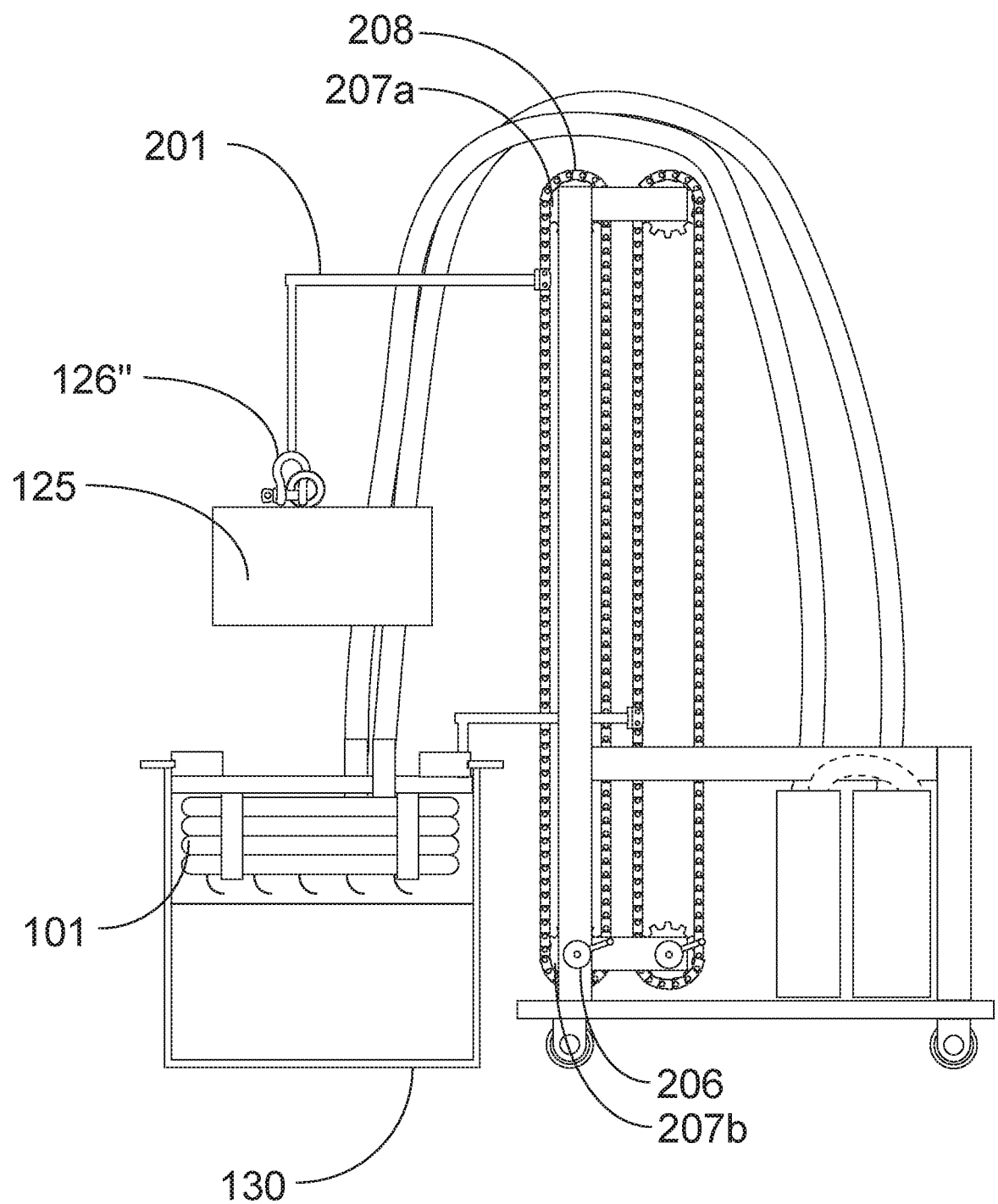
FIG. 12 depicts the device shown in FIG. 10, in which the clevis and object have been raised from the immersion cooling tank, in accordance with some embodiments of the present invention.

In another variation, as shown in FIGS. 10 through 12, the item lock may be configured as a clevis 126" that is structured and arranged to mesh or lock with an eyebolt 134, lifting lug, and the like that is fixedly attached to the object 125. In operation, the clevis 126" (with its clevis pin removed) may be lowered (e.g., manually or automatically) through the opening 119 in the condensing device 101 into the heat transfer fluid 135 until the clevis 126" is proximate the eyebolt 134, lifting lug, and the like. Using a clevis pin, i.e., by inserting the clevis pin in the openings provided in the clevis 126" therefor, the clevis 126" may then be coupled (e.g., manually or mechanically) to the eyebolt 134, lifting lug, and the like. The clevis 126" and item 125 may then be raised out of the heat transfer fluid 135, through the opening 119 in the condensing device 101 to a desired elevation above the immersion cooling tank 130. Once heat transfer fluid 135 has been allowed to drained from the surface of the removed object 125, the object 125 may be removed from the clevis 126".

In an alternative embodiment, as shown in FIGS. 10 through 12, instead of using a hoisting or pulley system that includes a hoist wire 127, a winch 128, and a plurality of sheaves or pulleys 129, a chain hoist/forklift 200 may be used for selectively adjusting the height and the location of the condensing device 101, as well for selectively adjusting the height and location of the item lock 126 and object 125 to be removed from/installed in the immersion cooling tank 130. In some implementations, for the purpose of illustration rather than limitation, the chain hoist/forklift 200 may include a plurality of (e.g., two) roller chain systems or assemblies having a plurality of gear-wheels 204a, 204b, 207a, 207b; roller chains 205, 208; and winches 206, 209 that are structured and arranged to selectively raise and lower the condensing device 101, the item lock 126", and/or the object 125. In some implementations, the roller chain 208 of the first roller chain assembly may be operatively disposed about a first (e.g., an upper) gear wheel 207a and a second (e.g., lower) gear wheel 207b. A winch 206, mechanically coupled to one of the gear wheels 207a, 207b, e.g., to the second (e.g., lower) gear wheel 207b, may be structured and arranged to drive the second gear wheel 207b, causing the roller chain 208 to rotate about the gear wheels 207a, 207b. The roller chain 205 of the second roller chain assembly may be operatively disposed about a first (e.g., an upper) gear wheel 204a and a second (e.g., lower) gear wheel 204b. A winch 209, mechanically coupled to one of the gear wheels 204a, 204b, e.g., to the second (e.g., lower) gear wheel 204b, may be structured and arranged to drive the second gear wheel 204b, causing the roller chain 205 to rotate about the gear wheels 204a, 204b. The first (e.g., upper) gear wheels 204a, 207a may be idle wheels or, optionally, may also be mechanically coupled to a winch.

In some applications, a first mounting bracket 201 may be coupled to the item lock 126" and mechanically connected to the first roller chain 208, while a second mounting bracket 202 may be coupled to the condensing device 101 and mechanically connected to the second roller chain 205. Each of the first roller chain 208 and the second roller chain 205 may be independently and automatically operated to raise/lower the item lock 126" or the condensing device 101, respectively. For example, the first winch 206 and the first plurality (e.g., set or pair) of gear wheels 207a, 207b may be adapted to move the first roller chain 208, such that the movement of the first roller chain 208 adjusts the height of item lock 126". The second winch 209 and the second plurality (e.g., set or pair) of gear wheels 204a, 204b may be adapted to move the second roller chain 205, such that the movement adjusts the height of condensing device 101.

Although FIGS. 10 through 12 show an embodiment of a chain hoist/forklift 200 in which the first roller chain 208 and the second roller chain 205 appear to be aligned, one substantially behind the other, this is done for the purpose of illustration rather than limitation. Indeed, in some implementations, the first roller chain 208 and the second roller chain 205 may be configured in a side-by-side arrangement. When the first roller chain 208 and the second roller chain 205 are substantially aligned as shown in FIGS. 10 through 12, however, the first roller chain 208 and the second roller chain 205 should be offset, so that the paths of the first mounting bracket 201 and the second mounting bracket 202 do not interfere with one another. In some variations, a support structure 203 may be used to support the assembly for the second roller chain 205 and to connect the assembly for the second roller chain 205 to the assembly for the first roller chain 208. Optionally, instead of using a chain hoist/forklift 200, a belt drive drive/forklift may be used in its place, positioned and operated in a similar manner.

Figure 13:
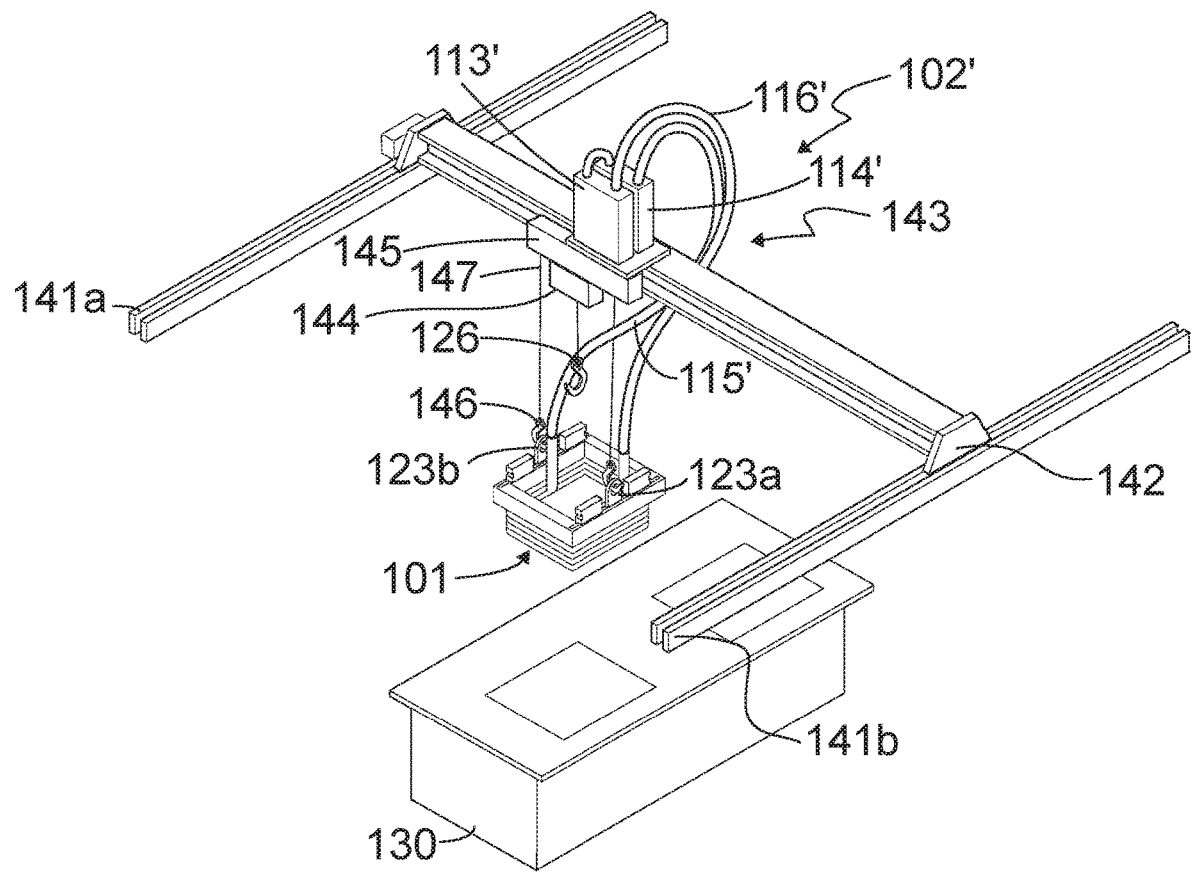
FIG. 13 depicts an isometric view of a fourth embodiment of a device for hot swapping an object that includes a hook as the item lock and that transports the condensing device along rails mounted to the ceiling, in accordance with some embodiments of the present invention.

In an alternative embodiment, in lieu of using a mobile crane 102 to selectively adjust the height and location of a condensing device 101, the apparatus for selectively adjusting the height and location of a condensing device 101 may consist of or consist essentially of an overhead (e.g., gantry, monorail, and so forth) crane 102'. For example, as shown in FIG. 13, the overhead crane 102' may include a pair of tracks 141a, 141b that are fixedly attached to a structure that is capable of supporting the weight of the crane 102', the condensing device 101, and any object(s) 125 contained in the immersion cooling tank 130. A selectively movable, motorized element 142 (e.g., a cross beam, a gantry girder, and the like) (hereinafter referred to as the "cross beam") may be operatively disposed on each of the tracks 141a, 141b, such that the motorized element 142 may translate in a first (e.g., a y-axis) direction that is parallel to the longitudinal axes of the tracks 141a, 141b. A second, selectively movable, motorized element 143 may be operatively disposed on the cross beam 142, such that the second motorized element 143 may translate in a second (e.g., an x-axis) direction that is perpendicular to the longitudinal axes of the tracks 141a, 141b.

In some implementations, the second motorized element 143 may be further structured and arranged to support a first winch assembly 144, a second winch assembly 145, and a coolant system 112'. The first winch assembly 144 may be operatively coupled to and configured for selectively adjusting the height of a unit lock 126. The second winch assembly 145 may be operatively coupled to one or more attaching devices 146 (e.g., hooks, devises, and the like) that are adapted to be removably attachable to connection devices 123*a*, 123*b* fixedly attached to the condensing device 101. In some variations, the second winch assembly 145 may selectively adjust the height of the attaching devices 146 via one or more cables 147.

In some embodiments, coolant system 112' may include a chiller pump 114' and a coolant container 113' that are structured and arranged to provide fluid coolant serially through a coolant delivery conduit 115', the condensing device 101, a coolant return conduit 116', and the coolant container 113'. As shown in FIG. 13, the chiller pump 114' and coolant container 113' may be supported above the second motorized element 143 on a substrate or platform.

Figure 14:
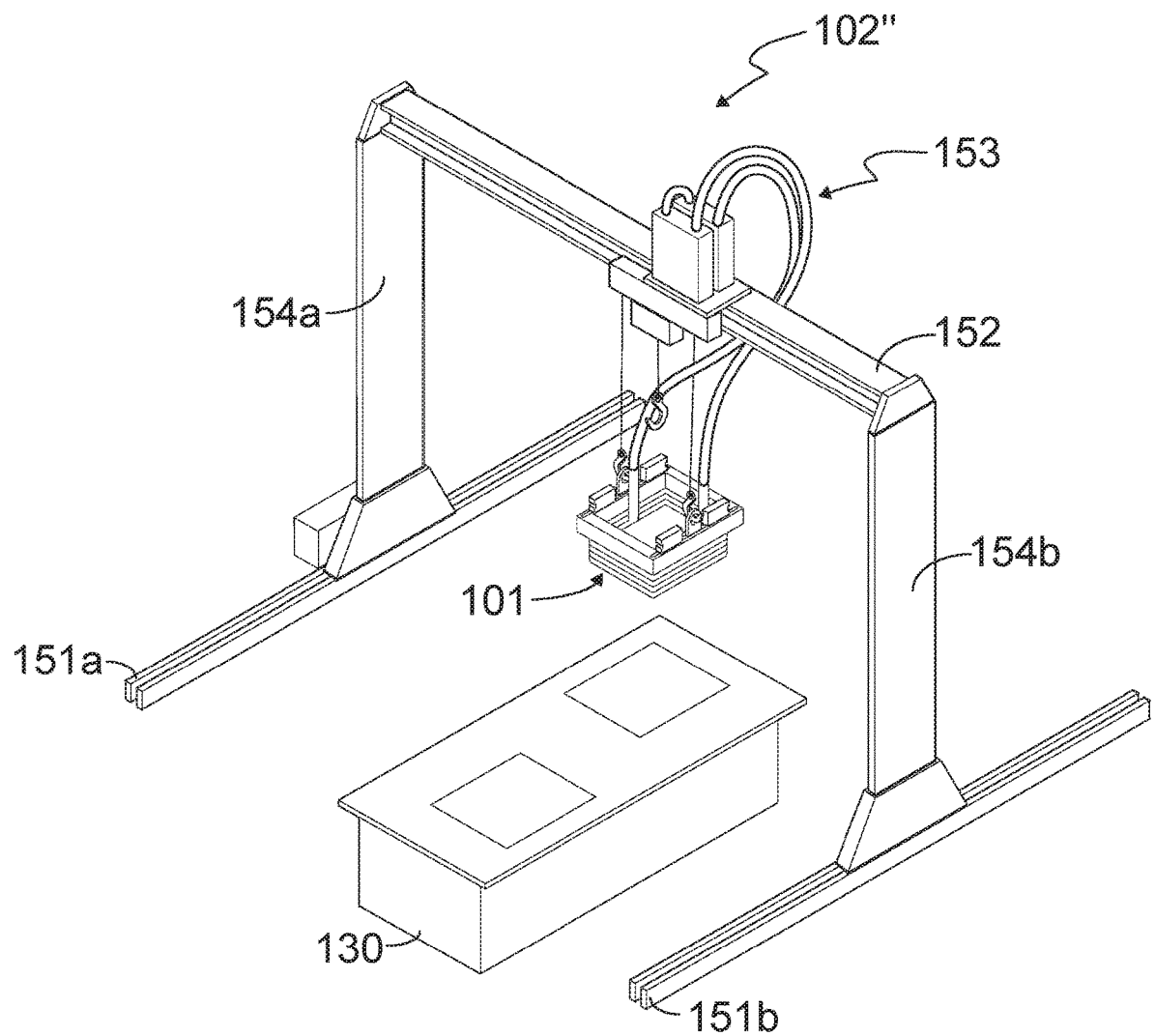
FIG. 14 depicts an isometric view of a fifth embodiment of a device for hot swapping an object that includes a hook as the item lock and that transports the condensing device along rails mounted to the ground, in accordance with some embodiments of the present invention.

In yet alternative embodiment, the apparatus for selectively adjusting the height and location of a condensing device 101 may consist of or consist essentially of a bridge-type crane 102". For example, as shown in FIG. 14, the bridge-type crane 102" may include a pair of tracks 151*a*, 151*b*. A pair of selectively movable, motorized elements 154*a*, 154*b* (e.g., columns) may be operatively disposed on each of the tracks 151*a*, 151*b*, such that the motorized elements 154*a*, 154*b* may translate in a first (e.g., a y-axis) direction that is parallel to the longitudinal axes of the tracks 145*a*, 151*b*. A selectively movable, motorized element 152 (e.g., a cross beam a gantry girder, and the like) (hereinafter referred to as the "cross beam") may be operatively disposed on each of the columns 154*a*, 154*b*. A second, selectively movable, motorized element 153 may be operatively disposed on the cross beam 152, such that the second motorized element 153 may translate in a second (e.g., an x-axis) direction that is perpendicular to the longitudinal axes of the tracks 151*a*, 151*b*. In some implementations, the second motorized element 153 may be further structured and arranged to support a first winch assembly 144, a second winch assembly 145, and a coolant system 112', as previously described.

Figure 15:
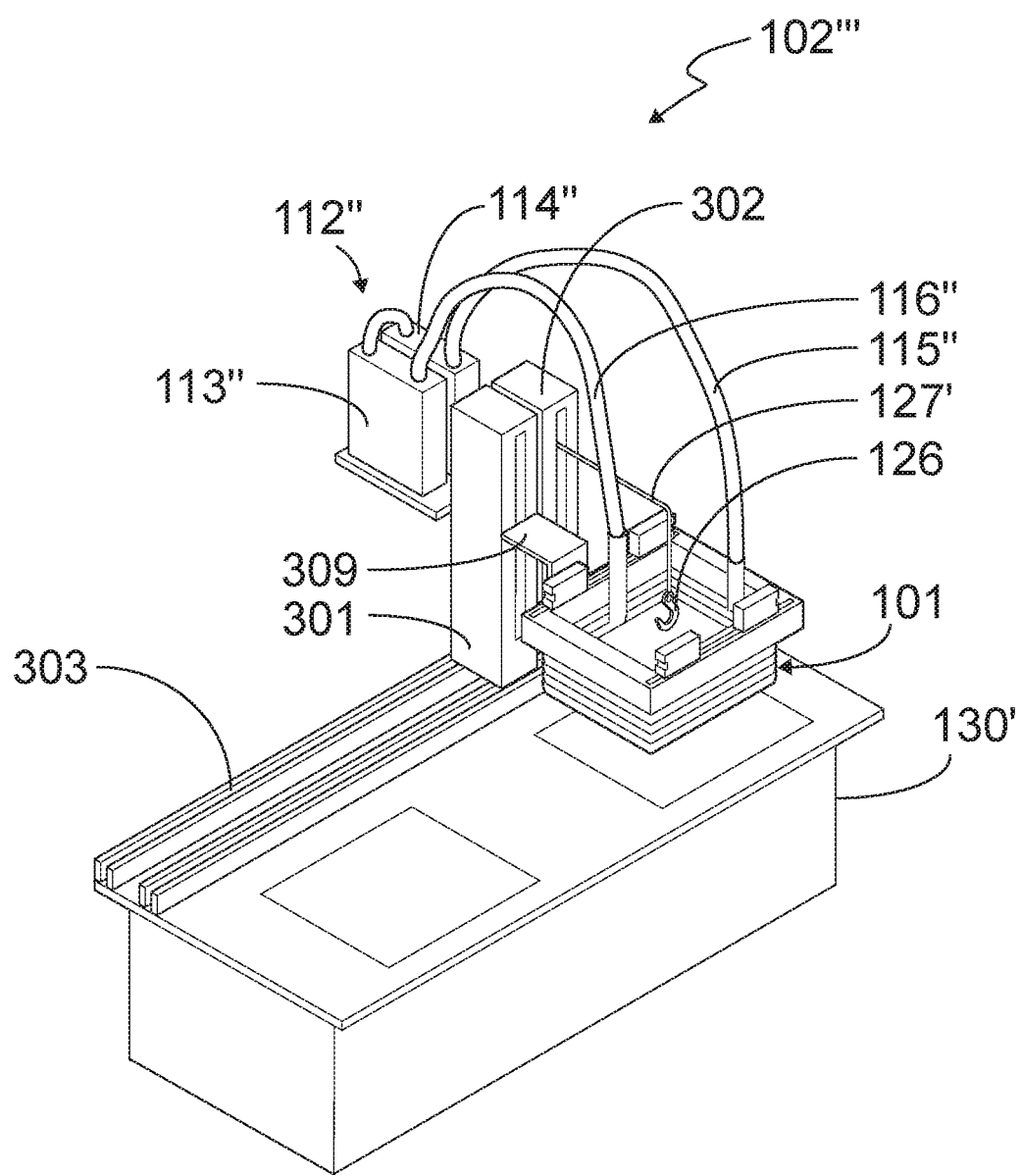
FIG. 15 depicts an isometric view of a sixth embodiment of a device for hot swapping an object that includes a hook as the item lock and that transports the condensing device along rails mounted to the immersion cooling tank, in accordance with some embodiments of the present invention.

In a further embodiment, as shown in FIG. 15, the apparatus 102''' for selectively adjusting the height and location of the condensing device 101 may consist of or consist essentially of one or more lifting towers 301, 302 that are configured to be movable (e.g., in a first (e.g., y-axis) direction) along fixed rails 303. In some implementations, the fixed rails 303 may be immobile and fixedly attached to (e.g., mounted on) the immersion cooling tank 130'. Although the fixed rails 303 (in FIG. 15) only allow the lifting towers 301, 302 to move in a single (e.g., y-axis) direction, this is done for the purpose of illustration rather than limitation. Those of ordinary skill in the art can appreciate that the fixed rails 303 could be configured to be movable in the x-axis direction. Advantageously, for immersion cooling tanks 130" having multiple openings that are linearly aligned, such design enables the condensing device 101 to serve the multiple openings in the immersion cooling tank 130'.

In some variations, a first lifting tower 301 may be structured and arranged to selectively adjust the height of the condensing device 101, while a second lifting tower 302 may be structured and arranged to adjust the height of the unit lock (e.g., hook) 126', e.g., using an extension rod 127'. For example, the first lifting tower 301 may include an arm 309 that is removably attachable to the condensing device 101. A hoisting or elevating system operatively disposed within the first lifting tower 301 is configured to raise and lower the arm 309, which selectively adjusts the height or elevation of the condensing device 101. In like manner, a hoisting or elevating system operatively disposed within the second lifting tower 302 is configured to raise and lower the angled extension rod 127'. Although an angled extension rod 127' is shown in FIG. 15, this is done for the purpose of illustration rather than limitation. Those of ordinary skill in the art can appreciate that the angled extension 127' may be replaced with alternative raising devices (e.g., a flexible element, a chain, a rope, a hoist wire, and combinations thereof), as well as a straight extension rod.

A coolant system 112" for the embodied apparatus 102''' may be supported by and disposed behind the one or more lifting towers 301, 302. In some variations, the coolant system 112" may include a chiller pump 114" and a coolant container 113" that are structured and arranged to provide fluid coolant from the chiller pump 114" serially through a coolant delivery conduit 115", the condensing device 101, a coolant return conduit 116", and the coolant container 113".

Figure 16A:
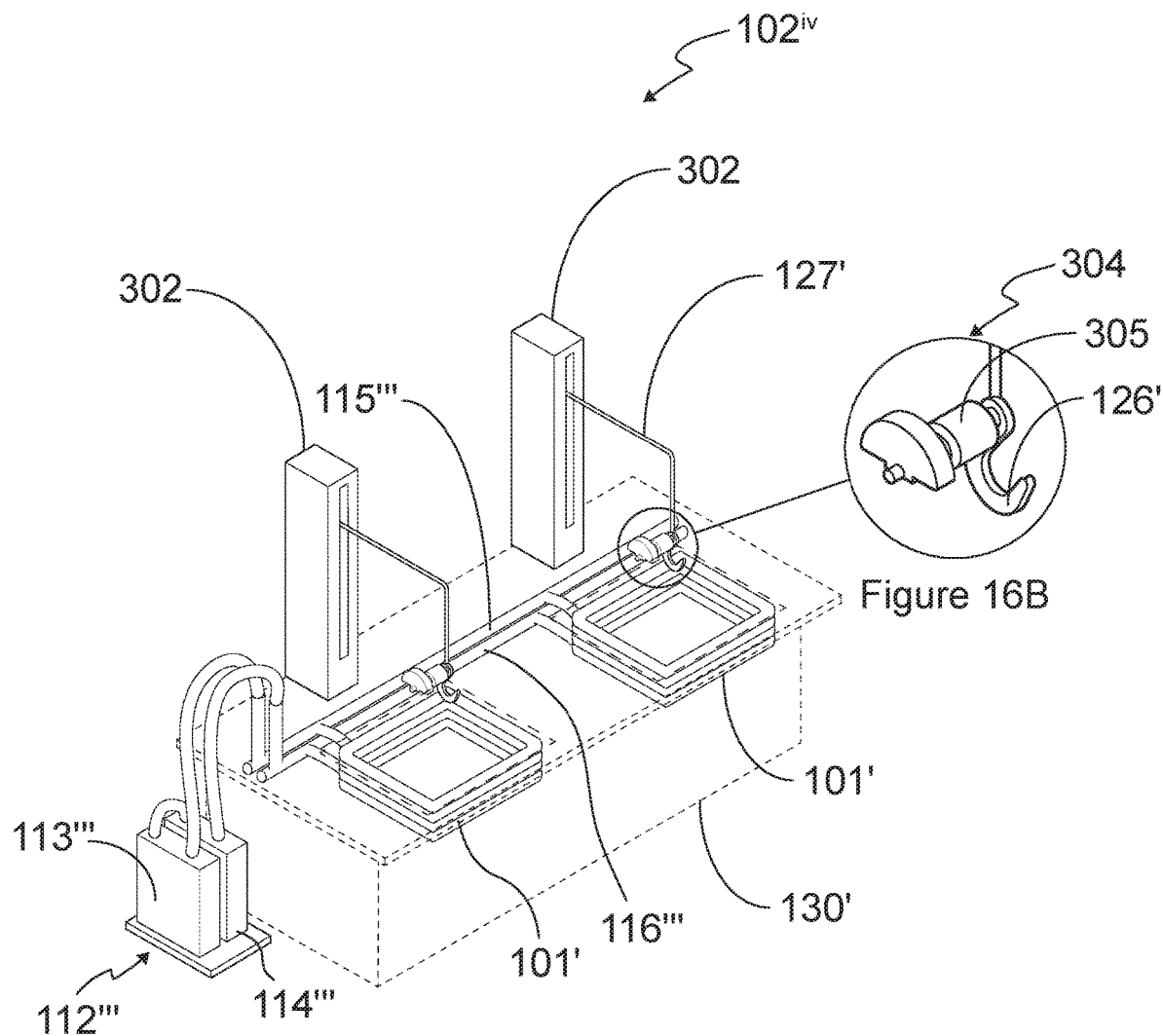
FIG. 16A depicts an isometric view of a seventh embodiment of a device for hot swapping an object that includes a hook coupled to a vibratory motor as the item lock and a condensing device that is mounted to the interior of the immersion cooling tank, in accordance with some embodiments of the present invention.
Figure 16A:
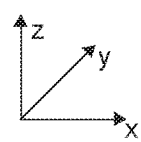
Figure 17A:
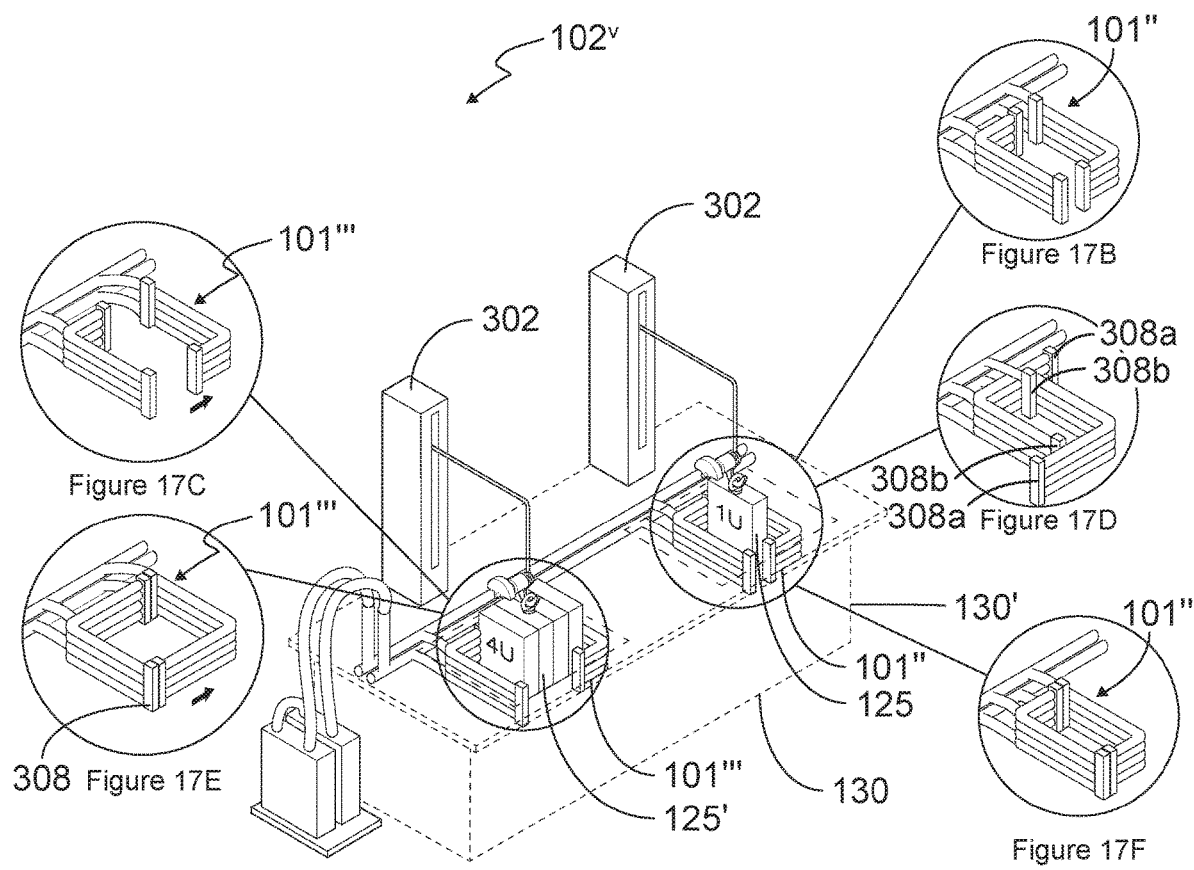
FIG. 17A depicts an isometric view of an eighth embodiment of a device for hot swapping an object that includes an adjustable condensing device having an adjustable opening size, in accordance with some embodiments of the present invention.

As shown in FIG. 16A, in another embodiment, condensing devices 101' may be removably attached or permanently attached to the immersion cooling tank 130' within a corresponding opening. The apparatus 102' for selectively adjusting the height of the item lock 304 may consist of or consist essentially of a lifting tower 302 installed on the immersion cooling tank 130', proximate the opening in the immersion cooling tank 101', in combination with an angled extension rod 127'. For example, the condensing device 101' may be mounted inside the immersion cooling tank 130', e.g., using a set of mounting brackets. Alternatively, the condensing device 101' may be welded to the internal wall of the immersion cooling tank 130'. In some variations, the immersion cooling tank 130' may be structured and arranged to include a mounting area for installing the lifting tower 302. The lifting tower 302, in turn, may be fixedly or movably installed. If fixedly installed, the lifting tower 302 may be configured to include a single opening within reach and every opening may be equipped with its own lifting tower (e.g., as shown in FIG. 17A). If movably installed, the lifting tower 302 may be placed on rails so that a single lifting tower can extract devices from any of the plural openings in the immersion cooling tank 130'.

As shown in FIG. 16B, in some applications, the item lock 304 may consist of or consist essentially of a vibration motor 305 movably or rigidly attached to a hook 126'. In operation, the vibration motor 305 produces vibration, for example, by rotating an unbalanced rotor. Advantageously, the vibration motor 305 may be turned ON before or during lifting of an object 125 to assist the draining of dielectric liquid from the object 125 back to the immersion cooling tank 130'. Although an unbalanced rotor-type vibration motor 305 is shown in FIG. 16B, this is done for the purpose of illustration rather than illustration. Indeed, those of ordinary skill in the art can appreciate that any device that is capable of producing vibrations (e.g., a piezoelectric device, an electromagnetic device, and the like) may be used to promote drainage of dielectric fluid.

In some variations, a coolant system 112''' for the embodied apparatus 102' may be disposed proximate the immersion cooling tank 130', for example, at one end of the immersion cooling tank 130'. In some variations, the coolant system 112''' may include a chiller pump 114''' and a coolant container 113''' that are structured and arranged to provide fluid coolant from the chiller pump 114''' serially through a coolant delivery conduit 115''', one or more condensing devices 101', a coolant return conduit 116''', and the coolant container 113'''. Since the condensing devices 101' are removably attached to the immersion cooling tank 130', all or some portions of the coolant delivery conduit 115''' and the coolant return conduit 116''' may also be removably or permanently attached to the immersion cooling tank 130'. Moreover, the coolant delivery conduits 115''' to the individual condensing devices 101' may be fluidically coupled to each other in series and the coolant return conduit 116''' from the individual condensing devices 101' may be fluidically coupled to each other in series.

FIGS. 17A through 17G depict variations to the apparatus 102$^v$ shown in FIG. 16A. Heretofore, a condensing device 101 having a fixed size and dimensions has been described for use. However, in an alternative embodiment, to allow for more efficient condensation of dielectric vapor located on the extracted electronic device 125, the size of the opening of the condensing device 101" may be selectively adjusted (e.g., based on the size of the electronic device 125 to be extracted therethrough) to a cross-sectional area between a minimum opening size and a maximum opening size. For example, if the electronic device 125 includes a single rack unit (i.e., "1U"), then the size of the opening in the condensing device 101" may be selectively altered (e.g., manually or automatically) to correspond to an opening size at or near its minimum opening size (FIG. 17B). In some implementations, the coolant lines are at their natural lengths when the condensing device is at minimum opening size. Thus, when the coolant lines are flexibly extended, the condensing device would be at maximum opening size. Alternatively, the coolant lines could also at its natural length when the condensing device is at maximum opening, then the coolant line could be curled into roll(s) when the condensing device is at minimum opening size. Alternatively, if another electronic device 125' includes 4 rack units ("4U"), the size of the opening of the condensing device 101''' may be selectively adjusted (e.g., manually or automatically) to correspond to an opening size that is at or near its maximum opening size (FIG. 17C).

As alternatives to the minimum and maximum opening sizes depicted in FIGS. 17B and 17C, respectively, instead of the condensing device 101''' having C-shaped halves with gaps or openings between the ends of the C-shaped halves in its minimum opening configuration (FIG. 17B), in an alternative embodiment, the gaps may be eliminated, such that opposing L-shaped halves touch each other at the maximum opening size (FIG. 17F). Moreover, instead of the condensing device 101''' having C-shaped halves with gaps or openings between the ends of the C-shaped halves in its maximum opening configuration (FIG. 17C), in an alternative embodiment, the gaps may be eliminated, such that opposing L-shaped halves touch each other at the maximum opening size (FIG. 17E). In some variations, a (e.g., elastic) thermally-conductive material 308 (e.g., thermo-conductive rubber and the like) may be used in instances in with the condensing devices 101", 101''' touch each other at both maximum or minimum opening sizes.

As shown in FIG. 17D, for condensing devices 101''' that touch each other at maximum opening, for such a condensing device 101''' to be selectively adjusted to correspond to its minimum opening size, one or both of the opposing L-shaped halves of the condensing device 101''' must be moved, such that some thermally-conductive elements 308$a$ protrude past the other thermally-conductive elements 308$b$. Typically, the coolant lines may comprise flexible hoses (e.g., rubber, plastic, and the like), which are adapted to stretch and deform around the thermally-conductive elements. Alternatively, the distance between the coolant lines supplying the thermally-conductive elements 308$b$ could be larger than the height of the thermally-conductive elements 308$a$, so that the thermally-conductive elements 308$a$ can pass through the thermally-conductive elements 308$b$ without interference.

Figure 17G:
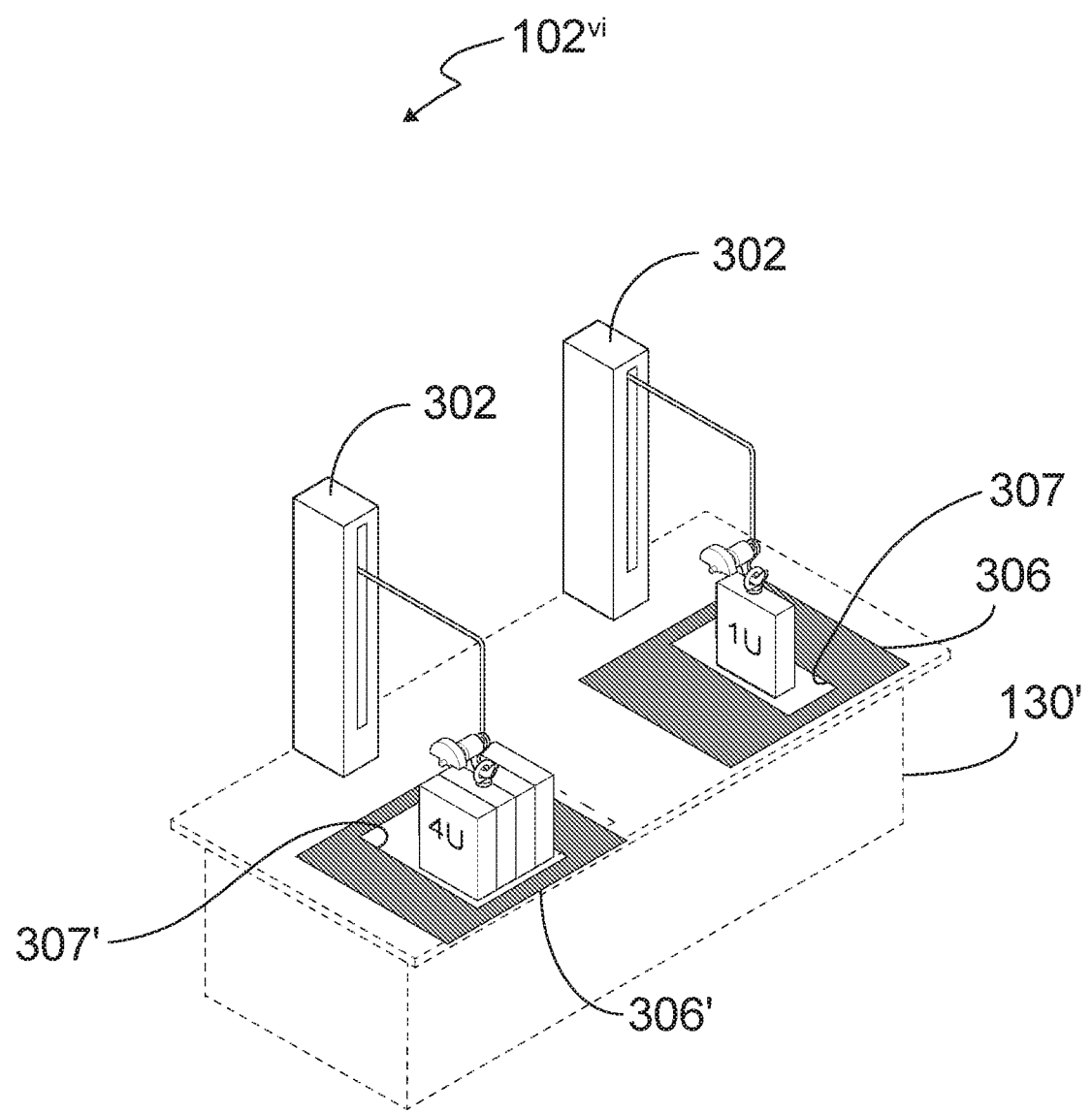
FIG. 17G depicts an isometric view of a ninth embodiment of a device for hot swapping an object that includes opening covers having adjustable opening sizes, in accordance with some embodiments of the present invention.

Optionally, as shown in FIG. 17G, a covering sheet 306, 306' of cover may be used to cover an unused portion of an opening in the immersion cooling tank 130', for example, to reduce fluid vapor loss. Advantageously, a plurality of covering sheets 306, 306' having variable or fixed size openings 307, 307' may be used. The cover 306' having a maximum size opening 307' may allow 4U devices to pass through, while the cover 306 having a minimum size opening 307 may only allow 1U devices to pass through. Those of ordinary skill in the art can appreciate that the opening size may be selected to allow devices smaller than 1U and larger than 4U to pass through them, as well as to allow devices larger than 1U but smaller than 4U.

Having described a device for hot swapping electronic or electric equipment of devices from a heat transfer fluid bath of an immersion cooling system, a method of hot swapping electronic or electric equipment of devices from a heat transfer fluid bath of an immersion cooling system will now be described. Advantageously, the embodied hot swapping method may occur while other electronic or electric equipment or devices contained in the immersion cooling bath continue to operate, to generate heat, and to cause heat transfer fluid to vaporize.

Figure 18:
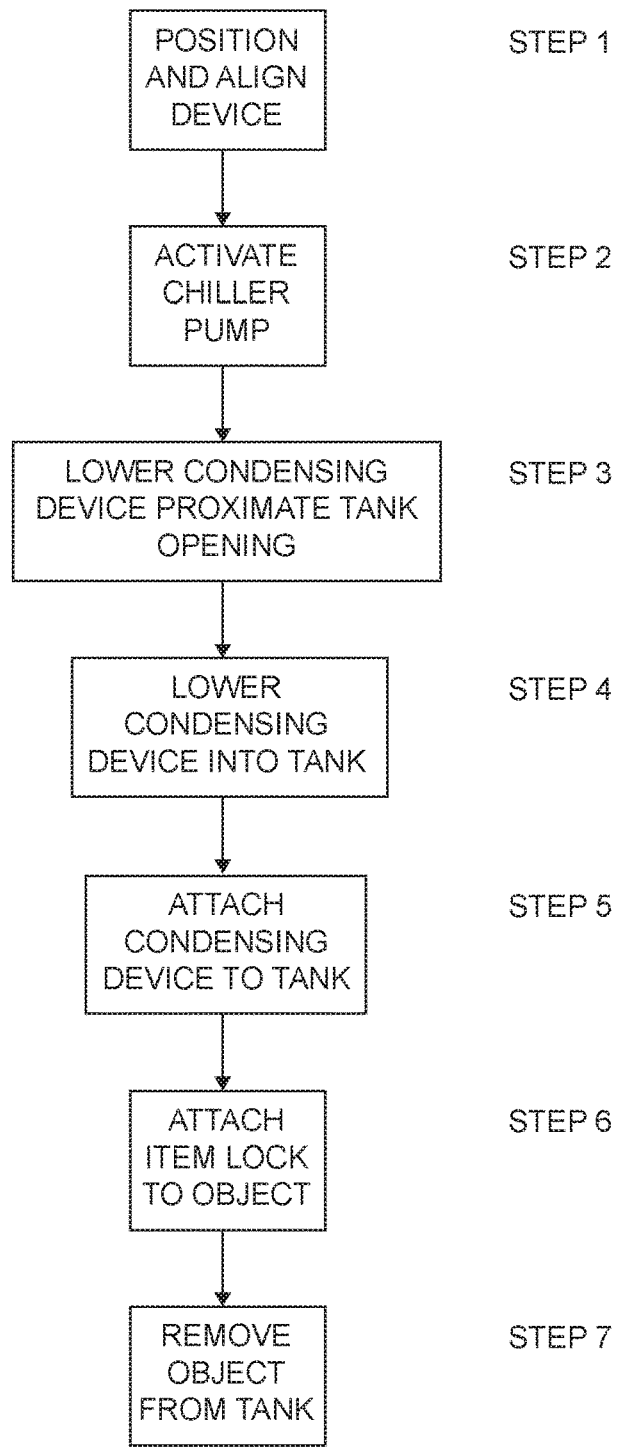
FIG. 18 is a flow chart of an exemplary method of hot swapping an object from an immersion cooling tank in accordance with some embodiments of the present invention.

Referring to the exemplary flow chart in FIG. 18, initially, while the immersion cooling tank is still covered, the device may be positioned, e.g., using the movable platform and/or the lifting arm, such that the condensing device is aligned with the opening of the immersion cooling tank (STEP 1). FIGS. 1A and 6 depict the device positioning and aligning the condensing device about the opening of the immersion cooling tank. Contemporaneously with positioning and aligning the condensing device (STEP 1), the chiller pump may be activated to initiate the flow of fluid coolant through the condensing device, e.g., the condensing coil (STEP 2). The coolant flow rate and coolant temperature may be adjusted to selectively and actively control condensation of the heat transfer fluid vapor once the condensing device has been lowered proximate the opening of the immersion cooling tank (STEP 3). Those of ordinary skill in the art can appreciate that chiller pump may be activated to initiate the flow of fluid coolant through the condensing device (STEP 2) at any time before the item lock and object(s) to be removed and may then be raised out of the heat transfer fluid bath (STEP 5).

Figure 7A:
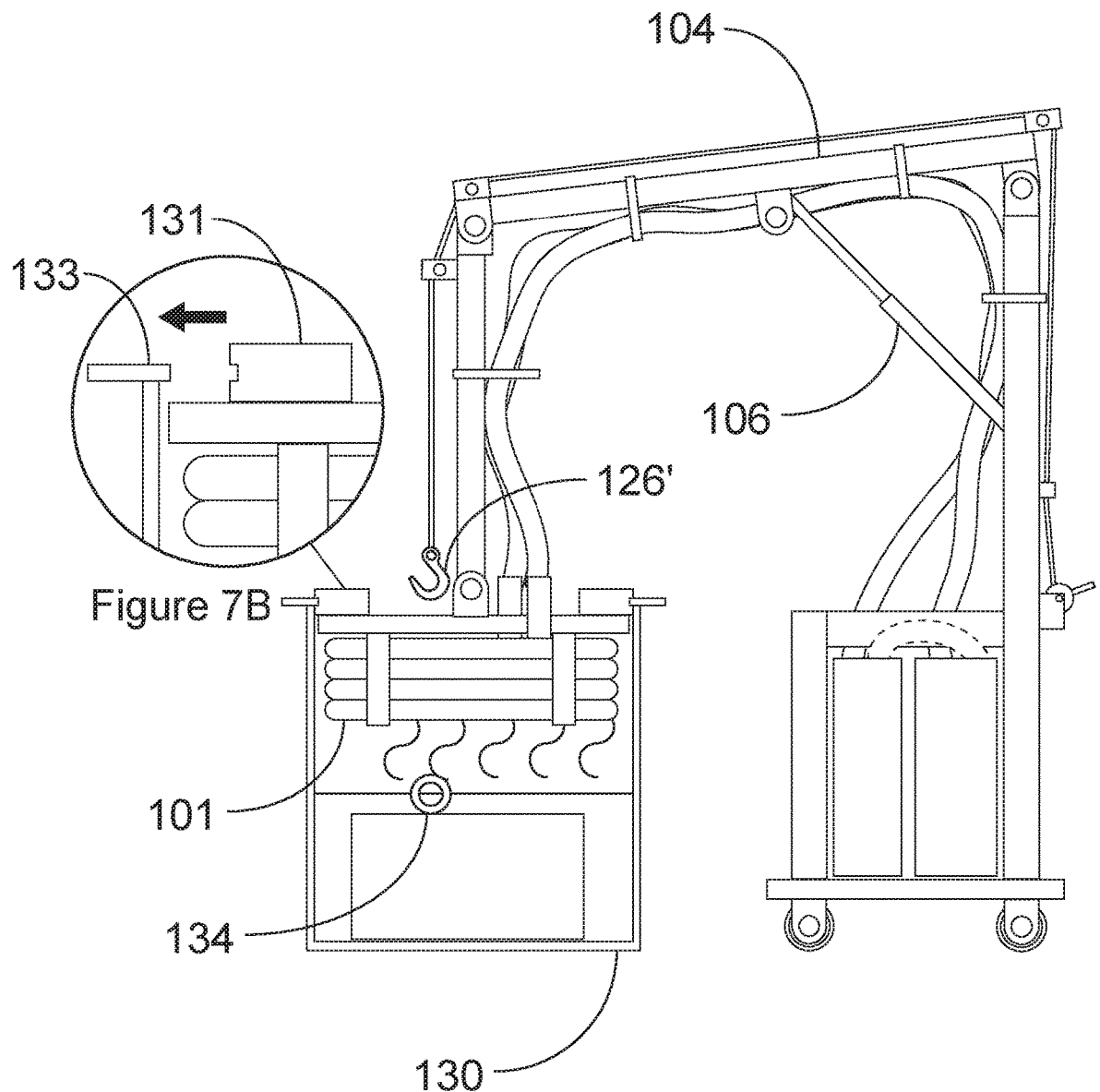
FIG. 7A depicts a side view of the device of FIG. 6, in which the condensing device has been lowered into the immersion cooling tank, in accordance with some embodiments of the present invention.

Once the coolant flow rate and temperature of the condensing device are at their predetermined marks, as shown in FIG. 3, the condensing device may be lowered into the opening of the immersion cooling tank (STEP 4). In some implementations, the condensing device may be lowered into the opening until the outer rim portion of the condensing device forms a full or a partial seal with the rim at the opening of the immersion cooling tank. In other implementations, after the condensing device has been lowered into the opening of the immersion cooling tank (STEP 4), as shown in FIGS. 7A, 7B, the condensing device may be releasably attached to a flange disposed about the rim of the immersion cooling tank, e.g., using a snap catch, a locking detainer, a plurality of sliding position locks, and the like (STEP 5). Advantageously, once the outer rim portion of the condensing device forms a full or partial seal with the immersion cooling tank, the size of the opening of the immersion cooling tank has been reduced to the size of the opening in the condensing coil. As a result, not only does condensation of the heat transfer fluid vapor proximate the exterior surface of the condensing device reduce or minimize the volume of heat transfer fluid vapor capable of escaping into the environment, but, also, the area available for heat transfer fluid vapor to escape has been reduced.

In another embodiment, while the immersion cooling tank is still covered, the device may be positioned, e.g., using the movable platform and/or the lifting arm, such that the condensing device is aligned with the opening of the immersion cooling tank (STEP 1). After the condensing device has been lowered proximate the opening of the immersion cooling tank (STEP 2) lowering the condensing device into the opening of the immersion cooling tank (STEP 3) may be optional since it is not required for condensing device designed to be placed at or above the opening of the immersion cooling tank. Moreover, attaching the condensing device to a flange disposed about the rim of the immersion cooling tank, e.g., using a snap catch, a locking detainer, a plurality of sliding position locks, and the like, may also be optional (STEP 4).

Figure 8:
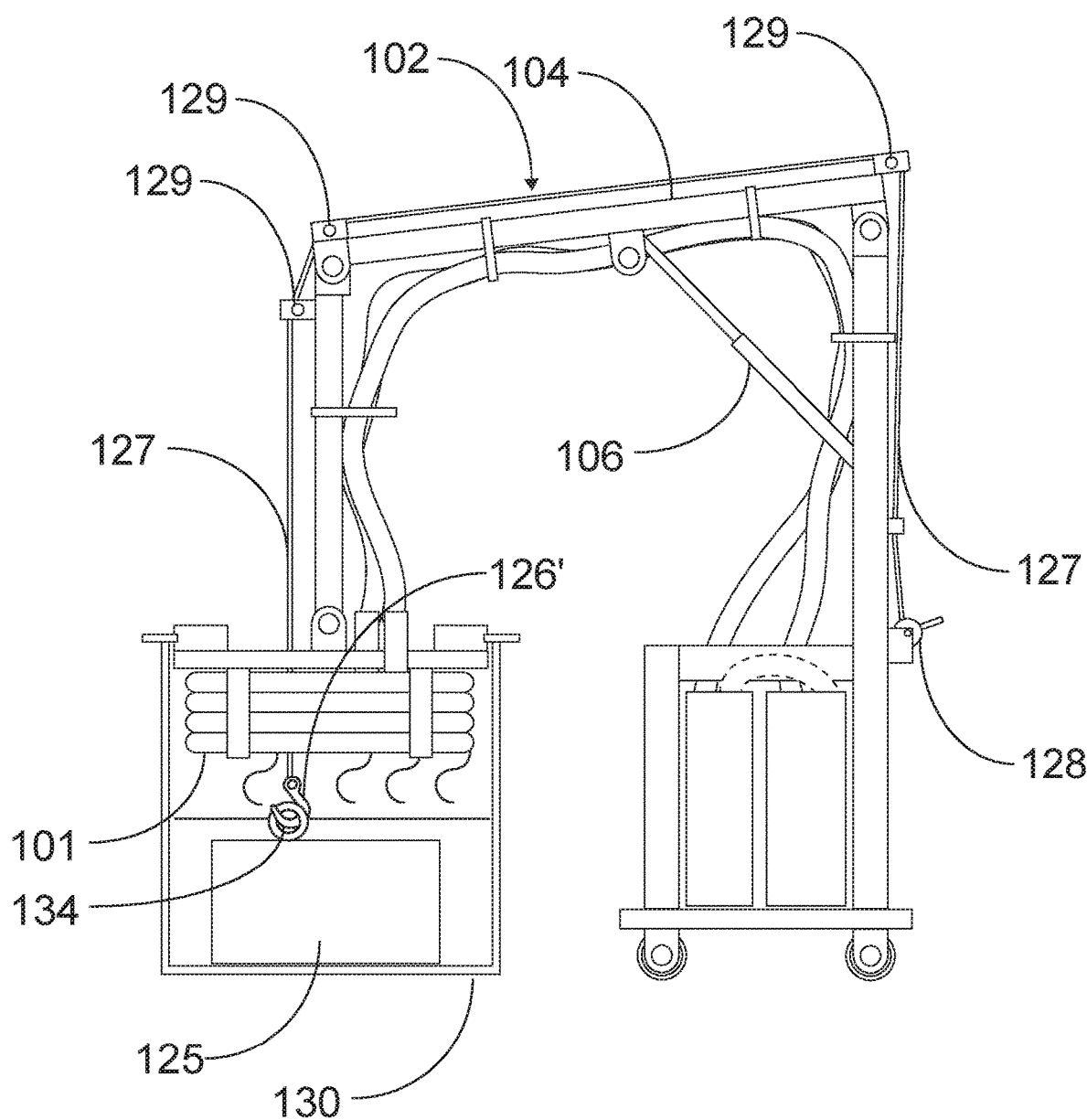
FIG. 8 depicts the device of FIG. 6 in which the hook is coupled to a lifting lug on the object to be removed from the immersion cooling tank, in accordance with some embodiments of the present invention.

Subsequently, an item lock may be lowered into the heat transfer fluid bath, through the opening in the condensing device, and the item lock may be releasably attached to the object(s) to be removed from the heat transfer fluid bath (STEP 6). Lowering the item lock may be performed manually, e.g., using a hand crank and a winch, or automatically, e.g., using a hoisting/pulley system, chain hoist/forklift system, and so forth. FIGS. 4, 8, and 11 depict the item lock lowered into the heat transfer (dielectric) fluid bath. Connecting to and/or capturing the object may be performed manually by an operator or by means of a self-aligning/self-adjusting capability of the item lock to detect and attach to/clutch the object.

Figure 9:
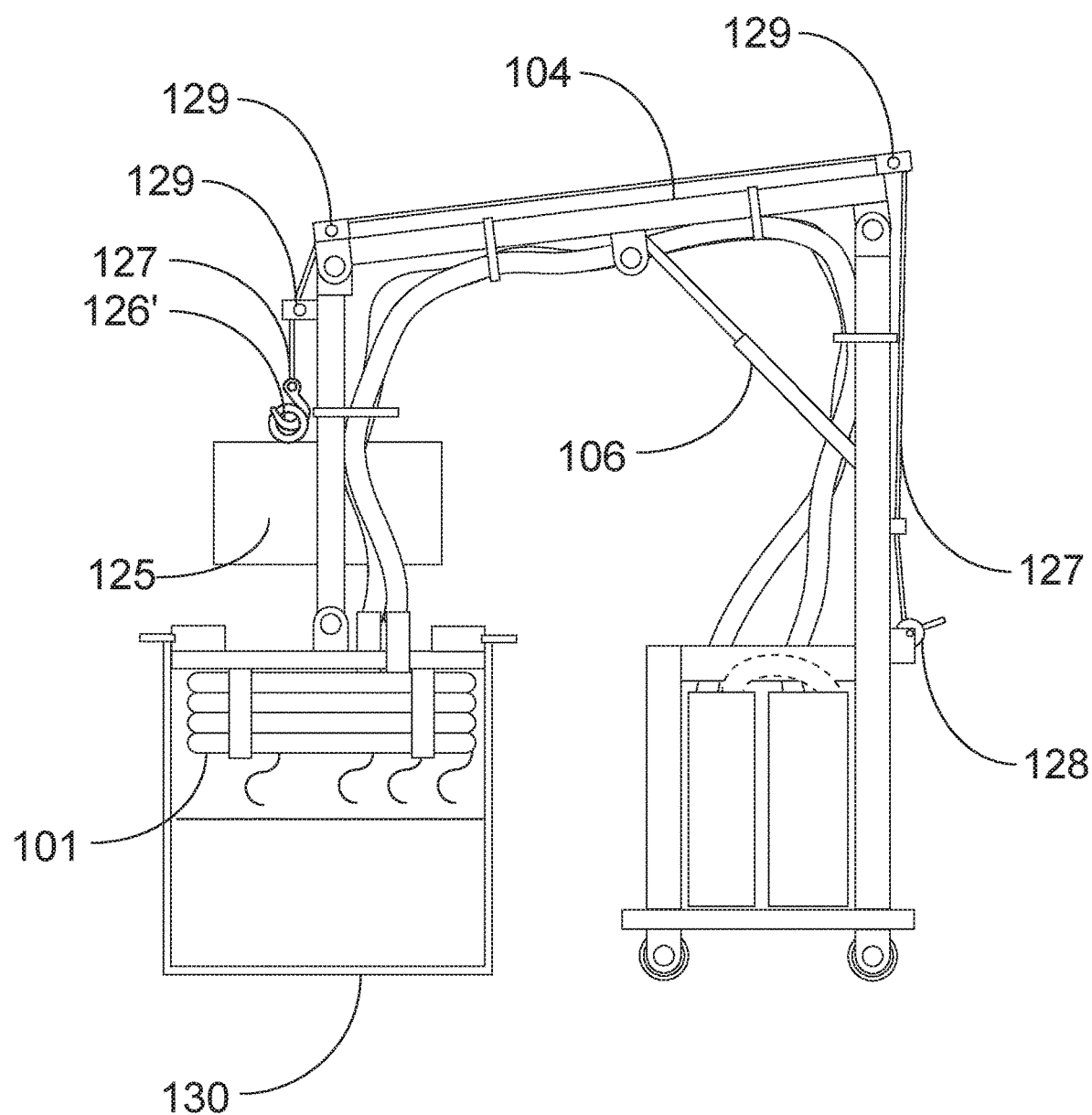
FIG. 9 depicts the device of FIG. 6 in which the hook and object have been removed from the immersion cooling tank, in accordance with some embodiments of the present invention.

Once the object(s) to be removed has been captured/secured by the item lock, the item lock and object(s) to be removed may then be raised out of the heat transfer fluid bath (STEP 7), through the opening in the condensing device. For example, the item lock and object(s) to be removed may be raised manually, e.g., using a hand crank and winch, or automatically, e.g., using a hoisting/pulley system, a chain hoist/forklift system, and so forth. FIGS. 5, 9, and 12 depict the item lock and removed object raised out of the heat transfer fluid bath. Once heat transfer fluid on the exterior surface of the object to be removed has been allowed to drain back into heat transfer fluid bath in the immersion cooling tank, the object(s) may then be released from the item lock and retrieved or removed.

To reinstall the removed object(s) and/or to insert a replacement object(s) in its place, either procedure described hereinabove may be reversed. Using the exemplary method, for example, the replacement object(s) may be attached to the item lock. The item lock and replacement object(s) may then be lowered into the heat transfer fluid bath, through the opening in the condensing device. For example, lowering may be performed manually, e.g., using a hand crank and a winch, or automatically, e.g., using the hoisting/pulley system, the chain hoist/forklift system, and so forth. Once the replacement object(s) is correctly positioned, the item lock may release the replacement object(s) and the item lock may be removed from the heat transfer fluid bath, through the opening in the condensing device. For example, the item lock and object may be raised manually, e.g., using a hand crank and a winch, or automatically, e.g., using the hoisting/pulley system, the chain hoist/forklift system, and so forth.

Once the item lock has been raised sufficiently to clear the opening in the condensing device, the condensing device may be raised, e.g., using the lifting device, from the opening of the immersion cooling tank. Alternatively, the item lock and the condensing device may be raised simultaneously. The immersion cooling tank may then be re-covered.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device for hot swapping at least one electronic device from an immersion cooling tank having a first opening, the device comprising:
   a condensing device, removably locatable in the first opening of the immersion cooling tank, the condensing device comprising a condensing coil forming a second opening through which the at least one electronic device is removable; and
   an apparatus coupled to the condensing device for selectively adjusting at least one of a height and a location of the condensing device about the first opening of the immersion cooling tank.

2. The device of claim 1, wherein the condensing device further comprises an outer rim portion connected to the condensing coil.

3. The device of claim 1, wherein the apparatus comprises a crane.

4. The device of claim 3, wherein the crane comprises:
   a lifting arm for adjusting the height of the condensing device;
   a movable platform operatively coupled to the lifting arm for adjusting the location of the condensing device; and
   a plurality of casters operatively coupled to a bottom portion of the movable platform for positioning the movable platform.

5. The device of claim 3, wherein the crane is integrated into a movable device selected from the group consisting of a self-powered device, an externally powered device, a forklift, and a truck.

6. The device of claim 1 further comprising:
   a coolant container in fluid communication with the condensing device; and
   a chiller pump for circulating a coolant fluid from the coolant container to the condensing device.

7. The device of claim 1 further comprising an item lock selectively attachable to the electronic device.

8. The device of claim 7 further comprising an apparatus for adjusting a height of the item lock.

9. The device of claim 8, wherein the apparatus for adjusting the height of the item lock comprises a pulley system.

10. The device of claim 9, wherein the pulley system comprises:
    a plurality of sheaves;
    a winch; and
    a hoist wire disposed through the plurality of sheaves and having a proximal end operatively attached to the winch and a distal end operatively attached to the item lock.

11. The device of claim 10, wherein the winch is at least one of a hand-operated winch and a motor-driven winch.

12. The device of claim 8, wherein the apparatus for adjusting the height of the item lock comprises at least one of a chain hoist/forklift assembly or a belt-drive/forklift assembly.

13. The device of claim 12, wherein the chain hoist/forklift assembly comprises:
 a plurality of gear-wheels;
 a winch operatively coupled to at least one of the gear-wheels;
 a roller chain disposed about the gear-wheels; and
 a mounting bracket operatively coupled to the roller chain.

14. The device of claim 7, wherein the item lock comprises a vibration motor.

15. The device of claim 8, wherein the apparatus for adjusting the height of the item lock is selected from the group consisting of a gantry-type overhead crane, a monorail-type overhead crane, and a bridge-type overhead crane.

16. The device of claim 8, wherein the apparatus for adjusting the height of the item lock comprises an angled extension rod.

17. The device of claim 16, wherein the angled extension rod is operatively coupled to a lifting tower.

18. The device of claim 17, wherein the lifting tower is at least one of secured to the immersion cooling tank and selectively movable along the immersion cooling tank.

19. The device of claim 1, wherein an outer peripheral surface of the condensing coil is adapted to fit within an inner peripheral surface of the immersion cooling tank.

20. The device of claim 2, wherein at least one outer peripheral dimension of the outer rim portion is larger than at least one inner peripheral dimension of the immersion cooling tank.

21. The device of claim 1, wherein the condensing device comprises an adjustable condensing device having a selectively variable second opening.

22. The device of claim 1 further comprising a cover for the first opening of the immersion cooling tank.

23. The device of claim 22, wherein the cover comprises a sheet with at least one of fixed or variable opening dimensions.

24. A method of hot swapping at least one electronic device from an immersion cooling tank having a first opening, the method comprising:
 providing a condensing device comprising a condensing coil forming a second opening;
 providing an apparatus coupled to the condensing device;
 using the apparatus to selectively adjust a height and a location of the condensing device about the first opening of the immersion cooling tank;
 inserting an item lock into the immersion cooling tank through the second opening; and
 removing, with the item lock, the at least one electronic device from the immersion cooling tank via the second opening.

25. The method of claim 24, wherein the apparatus comprises a crane.

26. The method of claim 24, wherein inserting the item lock comprises using a pulley system to at least one of raise and lower the item lock.

27. The method of claim 24, wherein the second opening is smaller than the first opening.

* * * * *